(12) United States Patent
Lee et al.

(10) Patent No.: US 8,754,674 B2
(45) Date of Patent: Jun. 17, 2014

(54) GATE DRIVE CIRCUIT AND METHOD OF DRIVING THE SAME

(75) Inventors: Jae-Hoon Lee, Seoul (KR); Seung-Hwan Moon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 1034 days.

(21) Appl. No.: 12/764,433

(22) Filed: Apr. 21, 2010

(65) Prior Publication Data

US 2010/0277206 A1 Nov. 4, 2010

(30) Foreign Application Priority Data

Apr. 30, 2009 (KR) ........................ 10-2009-0038072

(51) Int. Cl.
*H03K 3/00* (2006.01)

(52) U.S. Cl.
USPC .......................................................... 327/108

(58) Field of Classification Search
USPC .......................................................... 327/108
See application file for complete search history.

(56) References Cited

U.S. PATENT DOCUMENTS

2008/0036725 A1* 2/2008 Lee et al. ...................... 345/100

FOREIGN PATENT DOCUMENTS

| CN | 101089939 A | 12/2007 |
| CN | 101252353 A | 8/2008 |
| CN | 101303896 A | 11/2008 |
| JP | 2001506044 A | 5/2001 |
| JP | 2004199066 A | 7/2004 |
| JP | 2005222688 A | 8/2005 |
| JP | 2009015291 A | 1/2009 |
| KR | 10-2006-0078570 | 7/2006 |
| KR | 10-2007-0113983 | 11/2007 |

* cited by examiner

*Primary Examiner* — Daniel Rojas
(74) *Attorney, Agent, or Firm* — Cantor Colburn LLP

(57) ABSTRACT

In a gate drive circuit including stages which are cascaded and which output gate signals each of the stages includes a first node, an output part, a first holding part and a second holding part. A voltage of the first node is converted to a high voltage in response to one of a vertical start signal and a carry signal of one of previous stages. The output part outputs a first clock signal as a gate signal through an output terminal in response to the high voltage of the first node. The first holding part applies a first low voltage to the output terminal, in response to a gate signal output from at least one of following stages. The second holding part applies a second low voltage, which is less than the first low voltage, to the first node in response to a gate signal output from at least one stage among following stages.

14 Claims, 23 Drawing Sheets

GATE DRIVE CIRCUIT AND METHOD OF DRIVING THE SAME

This application claims priority to Korean Patent Application No. 2009-0038072, filed on Apr. 30, 2009, and all the benefits accruing therefrom under 35 U.S.C. §119, the content of which in its entirety is herein incorporated by reference.

BACKGROUND OF THE INVENTION (1) Field of the Invention

Exemplary embodiments of the present invention relate to a gate drive circuit and a method of driving the gate drive circuit. More particularly, exemplary embodiments of the present invention relate to a gate drive circuit which substantially enhances driving reliability and a method of driving the gate drive circuit.

(2) Description of the Related Art

Recently, to decrease a size of a liquid crystal display ("LCD") apparatus and to enhance manufacturing productivity of the LCD apparatus, a gate drive circuit has been integrated onto a display substrate using amorphous silicon gate ("ASG") technology.

Moreover, a size of transistors of the gate drive circuit has been reduced to decrease power consumption of a panel. A microfabrication process has been developed to manufacture the transistors having a small size. Thus, when the size of the transistors is decreased, the transistors are typically driven at a low voltage to decrease the power consumption.

However, when the size of the transistors is decreased, a leakage current is generated, and high temperature noise is thereby generated. More particularly, when the gate drive circuit is driven at a high temperature, noise defects, due to an abnormal gate-on signal generated during a gate-off signal interval, are generated.

BRIEF SUMMARY OF THE INVENTION

Exemplary embodiments of the present invention provide a gate drive circuit which substantially enhances driving reliability.

Exemplary embodiments of the present invention also provide a method of driving the above-mentioned gate drive circuit.

In an exemplary embodiment, a gate drive circuit including stages which are cascaded and which output gate signals is disclosed. Each of the stages includes a first node, an output part, a first holding part and a second holding part. A voltage of the first node is converted to a high voltage in response to one of a vertical start signal and a carry signal of one of previous stage. The output part outputs a first clock signal as a gate signal through an output terminal in response to the high voltage at the first node. The first holding part applies a first low voltage to the output terminal in response to a gate signal of a first subsequent stage. The second holding part applies a second low voltage, which is less than the first low voltage, to the first node in response to a gate signal of a second subsequent stage.

In an exemplary embodiment of the present invention, each of the stages may further include a second node which receives the second low voltage when the gate signal is outputted through the output terminal and the first node which receives the second low voltage based on a voltage of the second node.

In an exemplary embodiment of the present invention, the second node may further receive the second low voltage when a carry signal of the previous stage is applied thereto.

In an exemplary embodiment of the present invention, the first node may be bootstrapped when the gate signal is outputted through the output terminal, the first low voltage may be applied to the first node after the first node is bootstrapped, and the second low voltage may be applied to the first node in response to the gate signal of the second subsequent stage.

In an exemplary embodiment of the present invention, each of the stages may further include a carry part which outputs the first clock signal through a carry terminal in response to the high voltage of the first node, and the carry terminal may receive the second low voltage in response to a high voltage of the second node.

In an exemplary embodiment of the present invention, the carry part may be further turned on when a high voltage is applied to the carry terminal.

In an exemplary embodiment of the present invention, the carry part may be further turned on when a high voltage is applied to the output terminal.

In an alternative exemplary embodiment, a gate drive circuit including stages which are cascaded and which output gate signals is disclosed. Each of the stages includes a first node, an output part, a first holding part and a second holding part. A voltage of the first node is converted into a high voltage in response to one of a vertical start signal and a carry signal of a previous stage. The output part outputs a first clock signal as a gate signal through an output terminal in response to the high voltage of the first node. The first holding part applies a first low voltage to the output terminal in response to a carry signal of a first subsequent stage. The second holding part applies a second low voltage, which is less than the first low voltage, to the first node in response to a gate signal of a second subsequent stage.

In an exemplary embodiment, a gate drive circuit including stages which are cascaded and which output gate signals is disclosed. Each of the stages includes a first node, an output part, a first holding part and a second holding part. The first node is converted to a high voltage in response to one of a vertical start signal and a carry signal of a previous stage. The output part outputs a first clock signal as a gate signal through an output terminal in response to the high voltage of the first node. The first holding part applies a first low voltage to the output terminal in response to a gate signal of a first subsequent stage. The second holding part applies a dynamic low voltage having one of the first low voltage and a second low voltage, which is less than the first low voltage, to the first node in response to a gate signal of a second subsequent stage.

According to further still another aspect of the present invention, a gate drive circuit including stages which are cascaded and which output gate signals is disclosed. Each of the stages includes a first node, an output part, a first holding part and a second holding part. A voltage of the first node is converted into a high voltage in response to one of a vertical start signal and a carry signal of a previous stage. The output part outputs a first clock signal as a gate signal through an output terminal in response to the high voltage of the first node. The first holding part applies a first low voltage to the output terminal in response to a gate signal of a first subsequent stage. The second holding part applies a dynamic low voltage including one of the first low voltage and a second low voltage, which is less than the first low voltage, to the first node in response to a gate signal outputted from a second subsequent stage.

In an exemplar embodiment, a method of driving a gate drive circuit including cascaded stages which output gate signals is disclosed. The method of driving a gate drive circuit includes converting a voltage of a first node to a high voltage in response to one of a vertical start signal and a carry signal of a previous stage, outputting a first clock signal as a gate signal through an output terminal in response to the high voltage at the first node; applying a first low voltage to the output terminal in response to a gate signal of a first subsequent stage, and applying a second low voltage, which is less than the first low voltage, to the first node in response to a gate signal of a second subsequent stage.

In exemplary embodiments of a gate drive circuit, a negative voltage is applied to a control terminal of an output terminal of a gate drive circuit during an interval in which a gate signal is maintained at a low voltage, and thereby high temperature noise is substantially reduced. Thus, the gate drive circuit is driven for a long time.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
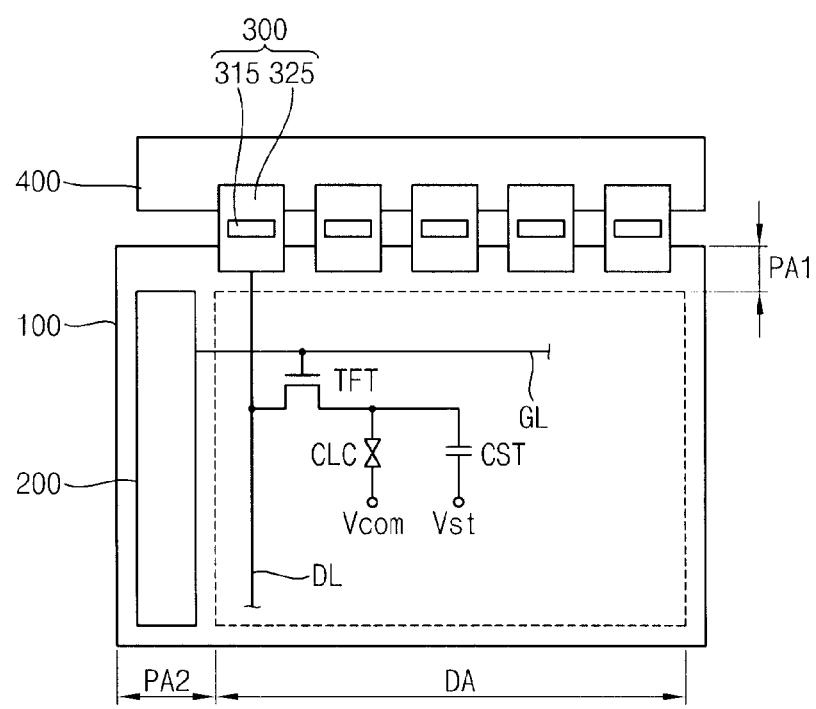
FIG. 1 is a plan view illustrating an exemplary embodiment of a display apparatus according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a plan view illustrating an exemplary embodiment of a display apparatus.

As shown in FIG. 1, the display apparatus may include a display panel 100, a gate drive circuit 200, a data drive circuit 300 and a printed circuit board ("PCB") 400.

The display panel 100 may include a display area DA and a peripheral area PA surrounding at least a portion of the display area DA.

Gate lines GL, data lines DL crossing the gate lines GL and pixel parts P may be disposed on the display area DA. Each of the pixel parts P includes a switching element SW electrically connected to gate lines GL and data lines DL, and a liquid crystal capacitor CLC and a storage capacitor CST that are electrically connected to the switching element SW. A common voltage Vcom may be applied to a common electrode of the liquid crystal capacitor CLC, and a storage common voltage Vst may be applied to a common electrode of the storage capacitor CST. In an exemplary embodiment, each of the pixel parts may not includes the storage capacitor.

The peripheral area PA includes a first peripheral area PA1 where terminals of the data lines are disposed and a second peripheral area PA2 where terminals of the gate lines GL are disposed.

The data drive circuit 300 may be disposed in the first peripheral area PA1. The data drive circuit 300 may include a data drive chip 315 which outputs data signals to the data lines DL and a flexible printed circuit board ("FPCB") 325 on which the data drive chip 315 is disposed. A first terminal of the FPCB 325 may be connected to the first peripheral area PA1, and a second terminal of the FPCB 325 may be connected to the PCB 400. The FPCB 325 electrically connects the PCB 400 to the display panel 100.

In an exemplary embodiment, the data drive chip 315 may be disposed on the FPCB 325. In an alternative exemplary embodiment, the data drive chip 315 may be disposed on the display panel 100. In an alternative exemplary embodiment, the data drive chip 315 may be disposed on the first peripheral area PA1 of the display panel 100.

The gate drive circuit 200 may be integrated on the second peripheral area PA2. Alternatively, the gate drive circuit 200 may be mounted on the second peripheral area PA2 in an integrated circuit ("IC") type when the display panel 100 is realized in a chip on glass ("COG") type. The gate drive circuit 200 includes a shift register in which stages are connected in a cascade arrangement and outputs gate signals to the gate lines GL.

Figure 2:
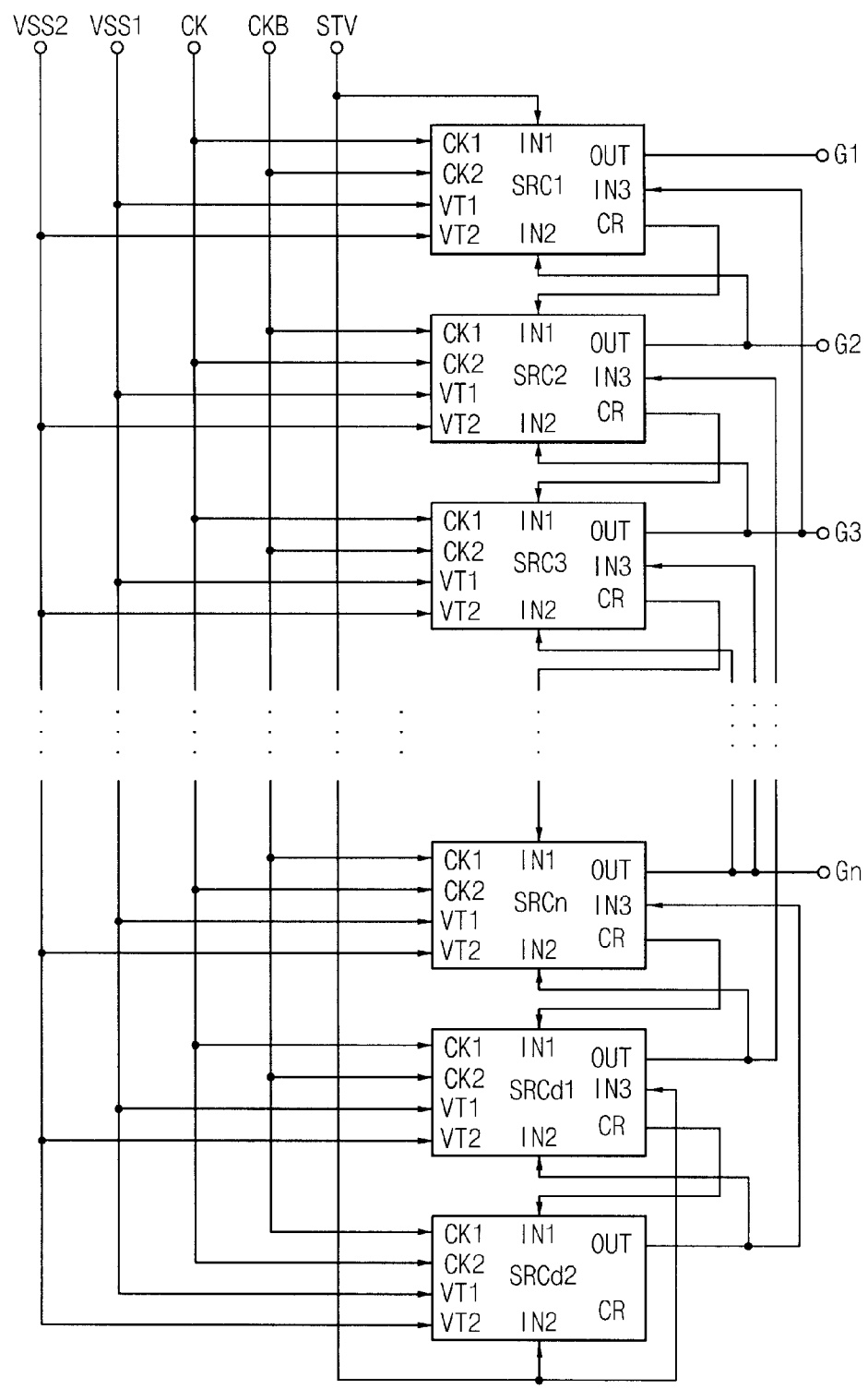
FIG. 2 is a block diagram illustrating an exemplary embodiment of a gate drive circuit of the display apparatus shown in FIG. 1.

FIG. 2 is a block diagram illustrating an exemplary embodiment of a gate drive circuit of the display apparatus shown in FIG. 1.

As shown in FIGS. 1 and 2, an exemplary embodiment of the gate drive circuit 200 includes a shift register in which stages SRC1 to SRCd2 are cascaded. The stages SRC1 to SRCd2 may include n driving stages SRC1 to SRCn and two dummy stages including a first dummy stage SRCd1 and a second dummy stage SRCd2. The n driving stages SRC1 to SRCn are connected to n gate lines G1 to Gn to output gate signals to the gate lines G1 to Gn. The first dummy stage SRCd1 and the second dummy stage SRCd2 are connected to a last driving stage of the n driving stages SRC1 to SRCn. In an alternative exemplary embodiment, a position and a number of dummy stages may be varied.

Each of the n driving stages SRC1 to SRCn and the first dummy stage SRCd1 includes a first clock terminal CK1, a second clock terminal CK2, a first input terminal IN1, a second input terminal IN2, a third input terminal IN3, a first voltage terminal VT1, a second voltage terminal VT2, a carry terminal CR and an output terminal OUT. The second dummy stage SRCd2 may include a first clock terminal CK1, a second clock terminal CK2, a first input terminal IN1, a second input terminal IN2, a first voltage terminal VT1, a second voltage terminal VT2, a carry terminal CR and an output terminal OUT.

The first and second clock terminal CK1 and CK2 receives a first clock signal CK and a second clock signal CKB having a phase opposite to a phase of the first clock signal CK. In an exemplary embodiment, the first clock terminal CK1 of odd-numbered stages, SRC1, SRC3, e.g., receives the first clock signal CK, and the second clock terminal CK2 of each of odd-numbered stages, SRC1, SRC3, e.g., receives the second clock signal CKB. The first clock terminal CK1 of each of even-numbered stages, SRC2, SRC4, e.g., receives the second clock signal CKB, and the second clock terminal CK2 of each of even-numbered stages, SRC2, SRC4, e.g., receives the first clock signal CK.

The first input terminal IN1 of each of the stages SRC1 to SRCd2 receives a vertical start signal STV or a carry signal of a previous stage, e.g., a preceding stage, of each of the stages. In an exemplary embodiment, a first input terminal IN1 of a first driving stage SRC1 receives the vertical start signal STV, and the first input terminal IN1 of each of the stages except for the first driving stage SRC2 to SRCd2 receives a carry signal of the previous stage.

The second input terminal IN2 of each of the stages receives a gate signal from a first subsequent stage, e.g., a first following stage or the vertical start signal STV. In an exemplary embodiment, a second input terminal IN2 of each of the n driving stages SRC1 to SRCn and the first dummy stage SRCd1 receives the gate signal from the first subsequent stage, for example, gate signals of a second driving stage to the second dummy stage SRC2 to SRCd2, respectively, and the second input terminal IN2 of the second dummy stage SRCd2 receives the vertical start signal STV.

A third input terminal IN3 of each of the stages receives a gate signal outputted from an output terminal OUT of a second subsequent stage, which outputs a gate signal to the second input terminal IN2 of each of the stages. In an exemplary embodiment, when a second input terminal IN2 of a k-th driving stage receives a gate signal of an (k+1)-th driving stage, a third input terminal IN3 of the k-th driving stage may receive a gate signal of an (k+2)-th stage. The third input terminal IN3 of the first dummy stage SRCd1 may receive the vertical start signal STV.

The first voltage terminal VT1 receives a first low voltage VSS1. The first low voltage is a logical value "0" at a shift register, which is a voltage value corresponding to a low voltage. In an exemplary embodiment, the first low voltage VSS1 may be about −6 V.

The second voltage terminal VT2 receives a second low voltage VSS2 that is lower than the first low voltage VSS1. In an exemplary embodiment, the second low voltage VSS2 may be about −11 V.

A carry terminal CR of each of the stages may be electrically connected to a first input terminal IN1 of the first subsequent stage of each of the stages and may output a carry signal to the first input terminal IN1 of the first subsequent stage of each of the stages.

An output terminal OUT of each of the stages may be electrically connected to one of the gate lines G1 to Gn corresponding to the output terminal OUT and output a gate signal to the one of the gate lines G1 to Gn. The output terminal OUT may be electrically connected to the second input terminal IN2 of one of previous stages and provide the gate signal to the first input terminal IN1 of one of the previous stages with a gate signal.

Figure 3:
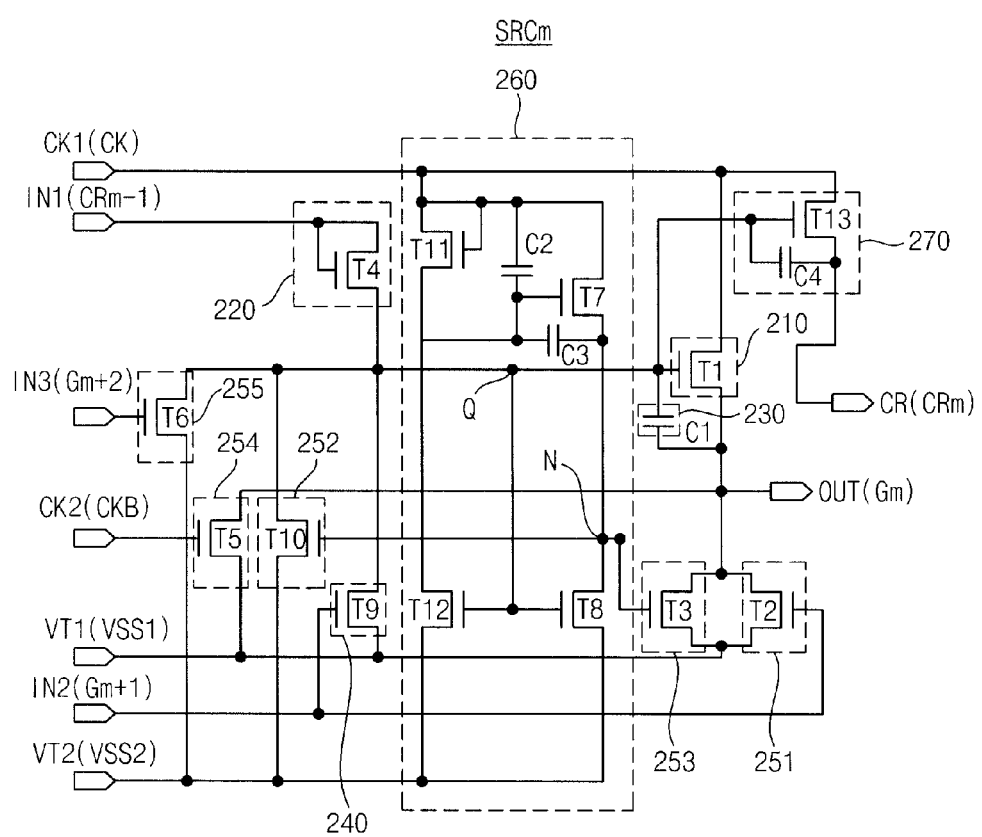
FIG. 3 is a schematic circuit diagram illustrating an exemplary embodiment of an m-th stage of the gate drive circuit shown in FIG. 2.
Figure 4:
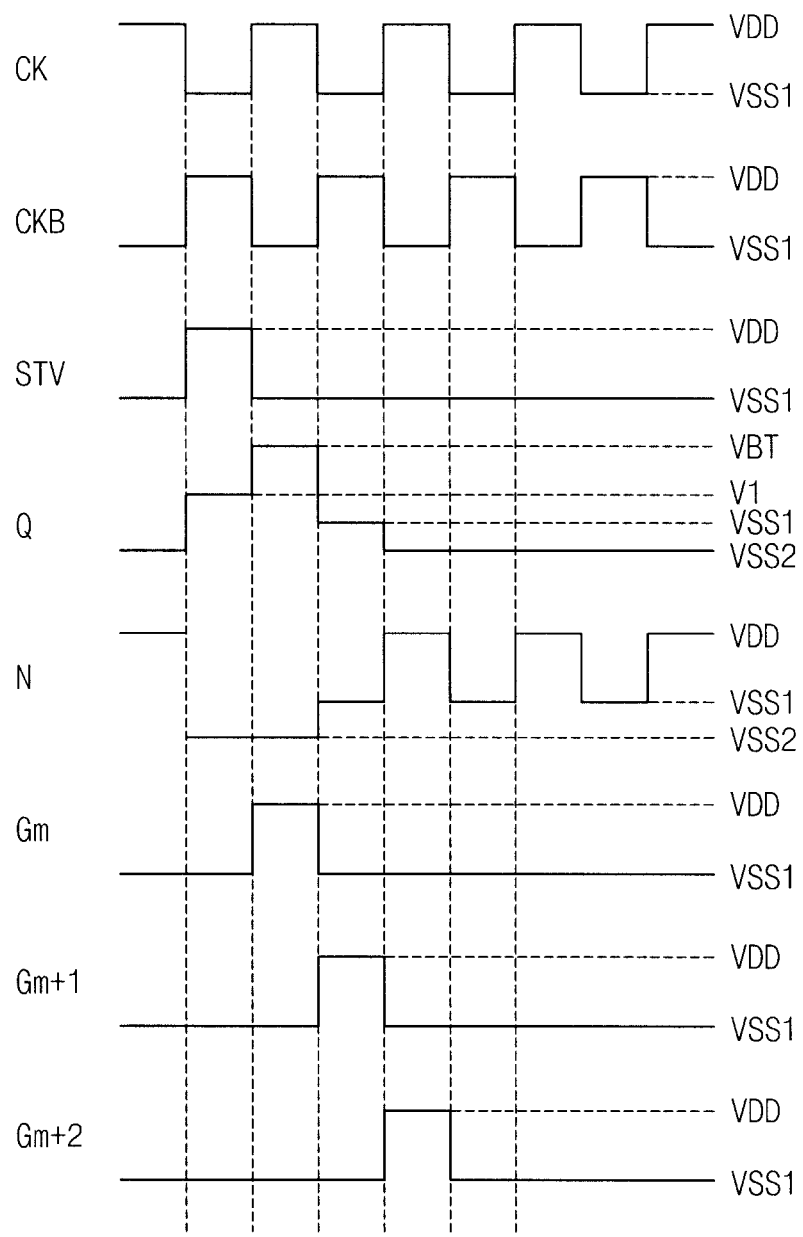
FIG. 4 is a signal timing diagram showing waveforms of input and output signals of the m-th stage shown in FIG. 3.

FIG. 3 is a schematic circuit diagram illustrating an exemplary embodiment of an m-th stage of the stages in FIG. 2. FIG. 4 is a signal timing diagram illustrating waveforms of input and output signals of the stage of the m-th stage of FIG. 3. In FIG. 4, it is described that a duty ratio of a first clock signal CK is about 50%. Alternatively, the first clock signal CK may have various duty ratios such as 30%, 35%, 40%, etc. In this case, duty ratios of a second clock signal CKB may be about 70%, 65%, 60%, etc.

As shown in FIGS. 3 and 4, the m-th stage SRCm may include an input part, an output part 210 and a holding part. The input part may include a first input terminal IN1 which receives a first input signal, a second input terminal IN2 which receives a second input signal and a third input terminal IN3 which receives a third input signal. In an exemplary embodiment, the first input signal is a vertical start signal STV or a carry signal of a previous stage of the m-th stage SRCm, for example, a carry signal CRm−1 of an (m−1)-th stage SRCm−1, and the second input signal is a gate signal of a first subsequent stage of the m-th stage SRCm, for example, a gate signal Gm+1 of the (m+1)-th stage SRCm+1. The third input signal may be a gate signal of a second subsequent stage of the m-th stage, for example, a gate signal Gm+2 of an (m+2)-th stage SRCm+2 where the second subsequent stage is one of the stages subsequent the first subsequent stage from which the m-th stage receives the output signal as the second input signal.

The output part 210 includes a first transistor T1. The first transistor T1 includes a drain electrode connected to a first clock terminal CK1, a gate electrode connected to a first node Q, and a source electrode connected to the output terminal OUT. The first node Q is boosted up to a high level by a carry signal. After the first node Q is boosted up to the high level, a first capacitor C1 connected to a gate electrode of the first transistor T1 and a drain electrode of the first transistor T1 may be charged. After the first transistor T1 of the output part 210 is turned on by a signal of the first node Q, the first transistor T1 may output the first clock signal CK as a gate signal, which is applied to the first clock terminal CK1.

The m-th stage SRCm may further include an output driving part which switches the output part 210 to turn on or off. In an exemplary embodiment, the output driving part may turn on the output part 210 in response to the carry signal CRm−1 of the (m−1)-th stage SRCm−1 or the vertical start signal STV, and turn off the output part 210 in response to the gate signal Gm+1 of the (m+1)-th stage SRCm+1. The output driving part may include a buffer part 220, a charging part 230 and a discharging part 240.

The buffer part 220 includes a fourth transistor T4. The fourth transistor T4 includes a gate electrode and a drain electrode, which are connected to the first input terminal IN1, and a source electrode connected to the first node Q.

The charging part 230 includes a first capacitor C1 including a first electrode connected to the first node Q and a second electrode connected to an output terminal OUT. The charging part 230 may be charged by a high voltage of the first input signal, which is applied to the first node Q from the first input terminal IN1 to maintain the first node Q at a high level. The first capacitor C1 may realize a parasitic capacitance of the first transistor T1.

The discharging part 240 includes a ninth transistor T9. The ninth transistor T9 includes a gate electrode connected to the second input terminal IN2, a source electrode connected to the first voltage terminal VT1, and a drain electrode connected to the first node Q.

When the fourth transistor T4 is turned on in response to a carry signal CRm−1 of the (m−1)-th stage SRCm−1, the charging part 230 is charged by applying the carry signal CRm−1 to the first node Q. When the charging part 230 is charged to a voltage substantially higher than a threshold voltage of the first transistor T1 and the first clock terminal CK1 receives a high voltage of the first clock signal CK, the first transistor T1 is bootstrapped. When the first transistor T1 is bootstrapped, the first node Q, connected to a gate electrode of the first transistor T1, is boosted to a boosting voltage VBT at a first voltage V1. The output part 210 outputs a high voltage of the first clock signal CK as an m-th gate signal Gm during an interval in which the boosting voltage VBT is applied to the first node Q.

When the ninth transistor T9 is turned on in response to a high level of the second input signal, the charging part 230 applies a first low voltage VSS1 applied to the first voltage terminal VT1 to the first node Q, and the charging part 230 is discharged to a voltage lower than a threshold voltage of the first transistor T1, and thereby the first transistor T1 is turned off.

The holding part may include a first holding part 251, a second holding part 252, a third holding part 253, a fourth holding part 254 and a fifth holding part 255.

The first holding part 251 includes a second transistor T2. The second transistor T2 includes a gate electrode connected to the second input terminal IN2, a source electrode connected to the first voltage terminal VT1, and a drain electrode connected to the output terminal OUT. The first holding part 251 pulls down a voltage of the output terminal OUT to the first low voltage VSS1 in response to a gate signal Gm+1 of the (m+1)-th stage SRCm+1, which is applied to the second input terminal IN2.

The second holding part 252 includes a tenth transistor T10. The tenth transistor T10 includes a gate electrode connected to a second node N, a source electrode connected to the second voltage terminal VT2 and a drain electrode connected to the first node Q. The second holding part 252 maintains a voltage of the first node Q at a second low voltage VSS2 applied to the second voltage terminal VT2 in response to a signal of the second node N.

The third holding part 253 includes a third transistor T3. The third transistor T3 includes a gate electrode connected to the second node N, a source electrode connected to the first voltage terminal VT1 and a drain electrode connected to the output terminal OUT. The third holding part 253 maintains a voltage of the output terminal OUT at the first low voltage VSS1 in response to a high voltage applied to the second node N.

The fourth holding part 254 includes a fifth transistor T5. The fifth transistor T5 includes a gate electrode connected to a second clock terminal CK2, a source electrode connected to the first voltage terminal VT1, and a drain electrode connected to the output terminal OUT. The fourth holding part 254 maintains a voltage of the output terminal OUT at the first low voltage VSS1 in response to a second clock signal CKB applied to the second clock terminal CK2.

The fifth holding part 255 includes a sixth transistor T6. The sixth transistor T6 includes a gate electrode connected to a third input terminal IN3, a source electrode connected to the second voltage terminal VT2, and a drain electrode connected to the first node Q. The fifth holding part 255 maintains a voltage of the first node Q at the second low voltage VSS2 in response to an (m+2)-th gate signal Gm+2 applied to the third input terminal IN3.

The m-th stage SRCm may further include a switching part 260 and a carry part 270.

The switching part 260 may include a seventh transistor T7, an eighth transistor T8, an eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2 and a source electrode connected to the second node N. The third capacitor C3 is connected to the gate electrode and the source electrode of the seventh transistor T7.

The eighth transistor T8 includes a gate electrode connected to the first node Q, a drain electrode connected to the second node N, and a source electrode connected to the second voltage terminal VT2.

The eleventh transistor T11 includes a source electrode connected to a drain electrode of the twelfth transistor T12, and a gate electrode and a drain electrode that are connected to the first clock terminal CK1.

The twelfth transistor T12 includes a gate electrode connected to the first node Q, a drain electrode connected to the source electrode of the eleventh transistor T11, and a source electrode connected to the second voltage terminal VT2.

While a high voltage is applied to the first node Q in one frame, the twelfth and eighth transistors T12 and T8 of the switching part 260 are turned on and thereby the second low voltage VSS2 is applied to the second node N. While a low voltage is applied to the first node Q in one frame, the twelfth and eighth transistors T12 and T8 of the switching part 260 are turned off, and thereby an equal signal that is substantially equal to the first clock signal CK received by the first clock terminal CK1 is applied to the second node N. When a voltage of the second node N is converted into a high level, the third transistor T3 is turned on, and thereby the first low voltage VSS1 is applied to the output terminal OUT.

The carry part 270 includes a thirteenth transistor T13. The thirteenth transistor T15 includes a gate electrode connected to the first node Q, a source electrode connected to a carry terminal CR, and a drain electrode connected to the first clock terminal CK1. The carry terminal 280 further includes a fourth capacitor C4 connected to the gate electrode of the thirteenth transistor T13 and the source electrode of the thirteenth transistor T13. When a high voltage is applied to the first node Q, the carry terminal 280 outputs the first clock signal CK as a carry signal.

In an alternative embodiment, the first low voltage VSS1 or the second low voltage VSS2 may be applied to the second voltage terminal VT2. For example, the first low voltage VSS1 may be applied to the second voltage terminal VT2 when the gate drive circuit is driven at room temperature, and the second low voltage VSS2 may be applied to the second voltage terminal VT2 when the gate drive circuit is driven at a high temperature to drive the gate drive circuit with low power.

Figure 5:
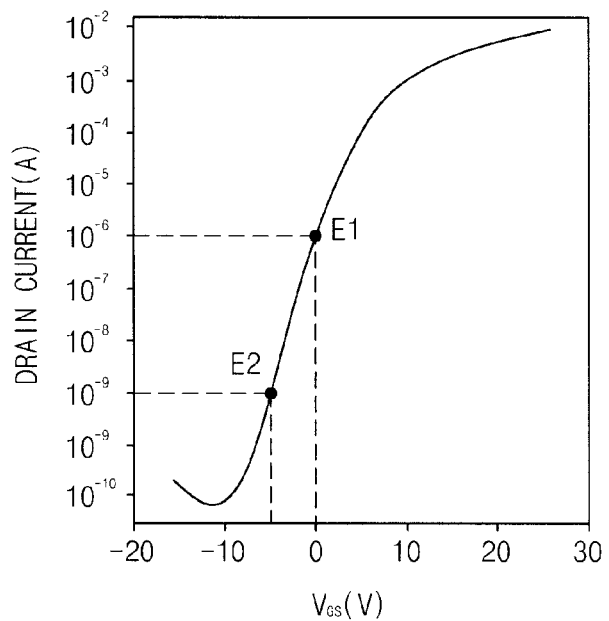
FIG. 5 is a graph of current versus voltage showing current-voltage characteristics of a first transistor of the m-th stage shown in FIG. 3.

FIG. 5 is a graph of current versus voltage showing current-voltage characteristics of a first transistor of the m-th stage shown in FIG. 3.

FIG. 5 shows a measured result of a drain current of the first transistor T1 when a channel length of the first transistor T1 is about 3.5 micrometer (μm) and corresponding to a gate-source voltage $V_{GS}$ between a gate electrode and a source electrode of the first transistor T1. As shown in FIG. 5, a drain current was about $10^{-6}$ ampere (A) when the gate-source voltage $V_{GS}$ of the first transistor T1 is about 0 V (shown as E1 at FIG. 5), and the drain current was about $10^{-9}$ A when the gate-source voltage $V_{GS}$ is about −5 V (shown as E2 at FIG. 5). As shown in FIG. 5, the drain current of the first transistor T1 when a gate-source voltage $V_{GS}$ is set to about 0 V is smaller than the drain current of the first transistor T1 when a gate-source voltage $V_{GS}$ is set to about −5 V.

Figure 6:
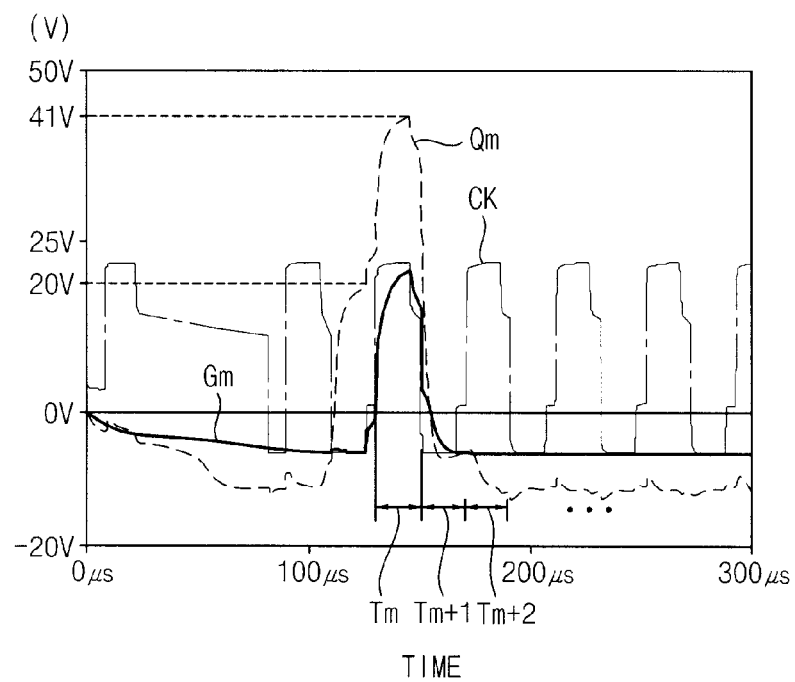
FIG. 6 is signal timing diagram showing a voltage variation of an m-th gate signal Gm at a first node Q, a first clock terminal CK1 and an output terminal OUT of the m-th stage shown in FIG. 3.

FIG. 6 is signal timing diagram showing a voltage variation at the first node Q of the m-th gate signal Gm, the first clock terminal CK1 and the output terminal OUT of the m-th stage SCRm of FIG. 3 when a channel length L of a first transistor T1 is about 3.5 μm.

In an m-th interval Tm, an m-th node signal Qm that is a signal of the first node Q is bootstrapped to about 41 V, and a high voltage of a first clock signal CK is output as an m-th gate signal Gm that is a signal of the output terminal OUT. In an (m+1)-th interval Tm+1, the first low voltage (VSS1= about −6 V) is applied to the first node Q of the m-th stage by a ninth transistor T9 that is turned on by an (m+1)-th gate signal Gm+1. In an (m+2)-th interval Tm+2, a second low voltage (VSS1=about −11 V) is applied to the first node Q of the m-th stage by the sixth transistor T6 that is turned on by an (m+2)-th gate signal Gm+2. The first node Q of the m-th stage is maintained at the second low voltage VSS2 by a tenth transistor T10 that is turned on in response to a high voltage applied to a second node N of the m-th stage.

As shown in FIG. 6, the m-th gate signal Gm is maintained at a low voltage in one frame, the first node Q connected to a gate electrode of the first transistor T1 is maintained at a second low voltage VSS2, and the output terminal OUT connected to a source electrode of the first transistor T1 is maintained at the first low voltage VSS1. Thus, gate-source voltage $V_{GS}$ of the first transistor T1 may be about −5 V.

In an exemplary embodiment, a drain current generated when the second low voltage VSS2 is applied to a gate terminal of the first transistor T1 is substantially smaller than a drain current generated when the first low voltage VSS1 applied to a gate terminal of the first transistor T1, so power consumption is substantially decreased.

When a conventional display apparatus is driven at a high temperature, a first transistor T1 may be abnormally driven due to a ripple generated at a voltage of a first node Q. When the first transistor T1 is abnormally driven, the conventional display apparatus may have display defects. In an exemplary embodiment of the present invention, a voltage of a first node Q1 of each of the stages is maintained at a second low voltage VSS2 that is lower than a first low voltage VSS1 after outputting a gate signal of the second subsequent stage of each of the stages to secure driving voltage margins even when a ripple is generated.

In an exemplary embodiment, a gate-source voltage $V_{GS}$ of the first transistor T1 may be set at a negative voltage while the m-th gate signal Gm is maintained at a low voltage, so that high temperature noise may be substantially removed.

Figure 7:
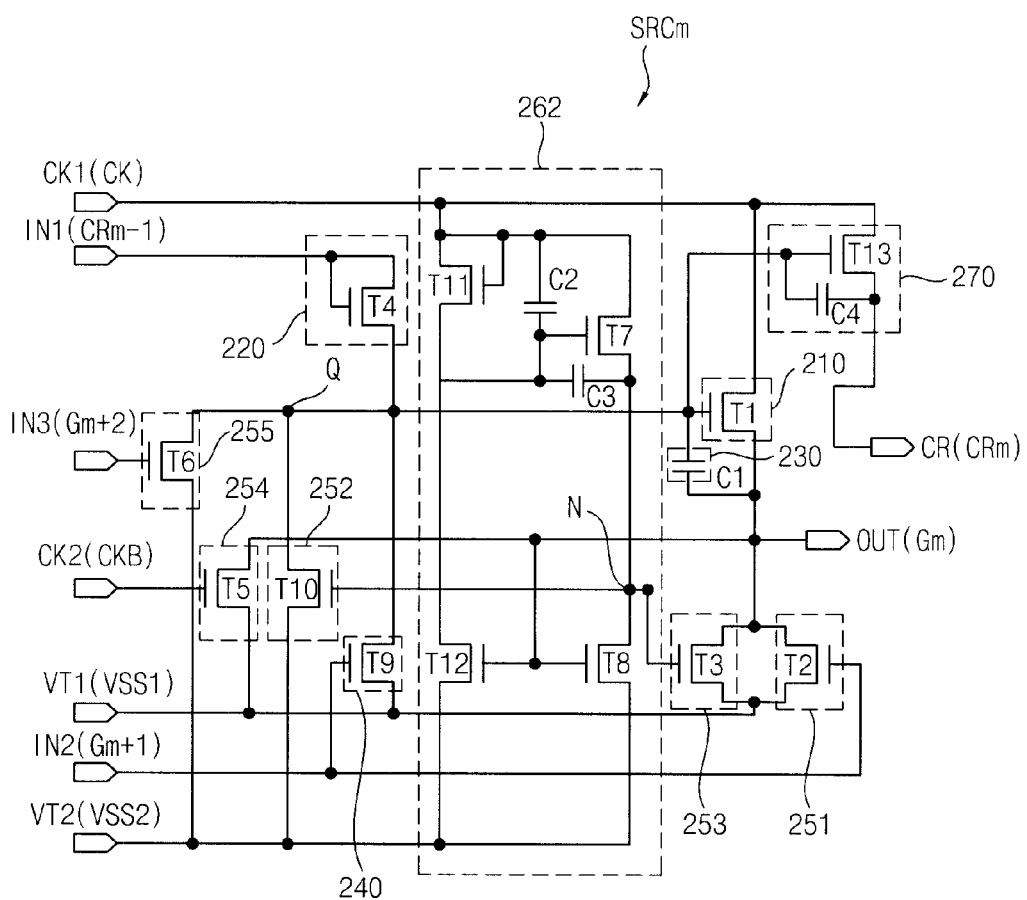
FIG. 7 is a schematic circuit diagram illustrating an alternative exemplary embodiment of an m-th stage according to the present invention.

FIG. 7 is a schematic circuit diagram illustrating an alternative exemplary embodiment of an m-th stage.

The schematic circuit diagram in FIG. 7 is substantially the same as the schematic circuit diagram shown in FIG. 3 except for a switching part 262. The same or like elements shown in FIG. 7 have been labeled with the same reference characters as used above to describe the exemplary embodiments of the m-th stage shown in FIG. 3, and any repetitive detailed description thereof will hereinafter be omitted or simplified.

As shown in FIG. 7, an m-th stage SRCm may include an input part, an output part 210, an output driving part, a holding part, a switching part 262 and a carry part 270. The output driving part may include a buffer part 220, a charging part 230 and a discharging part 240. The holding part may include a first holding part 251, a second holding part 252, a third holding part 253, a fourth holding part 254 and a fifth holding part 255.

The switching part 262 may include a seventh transistor T7, an eighth transistor T8, an eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2, and a source electrode connected to the second node N. The third capacitor C3 is connected to the gate electrode and source electrode of the seventh transistor T7.

The eighth transistor T8 includes a gate electrode connected to the output terminal OUT, a drain electrode connected to the second node N, and a source electrode connected to the second voltage terminal VT2. When a carry signal of a previous stage of the m-th stage is applied to the m-th stage, the second node N receives the second low voltage VSS2. In an exemplary embodiment, the twelfth transistor T12 includes a gate electrode connected to the output terminal OUT, and a source electrode connected to the second voltage terminal VT2. In an exemplary embodiment, gate electrodes of the eighth and twelfth transistors are connected to the output terminal OUT.

The eleventh transistor T11 includes a gate electrode and a drain electrode that are connected to the first clock terminal CK1, and a source electrode connected to the drain electrode of the twelfth transistor T12.

While the m-th gate signal Gm is maintained at a high voltage in one frame, the twelfth and eighth transistors T12 and T8 of the switching part 262 are turned on, and thereby a voltage of the second node N is discharged to the second low voltage VSS2. When the third transistor T3 is in a turned-off state, the first voltage terminal VT1 is electrically isolated from an output terminal OUT of an m-th stage. Thus, the m-th gate signal is not discharged to the first low voltage VSS1, and is substantially fully output through the output terminal OUT.

While the m-th gate signal Gm is maintained at a low voltage in one frame, the twelfth and eighth transistors T12 and T8 of the switching part 262 are turned off, and thereby an equal signal having a phase substantially equal to a phase of the first clock signal CK received from the first clock terminal CK1 is applied to the second node N. When a voltage of the second node N is converted into a high level, the third transistor T3 is turned on, and thereby the first low voltage VSS1 is applied to the output terminal OUT.

In an exemplary embodiment, a gate-source voltage $V_{GS}$ of the first transistor T1 may be a negative voltage during an interval in which the m-th gate signal Gm is maintained at a low voltage, so that high temperature noise is substantially removed.

Figure 8:
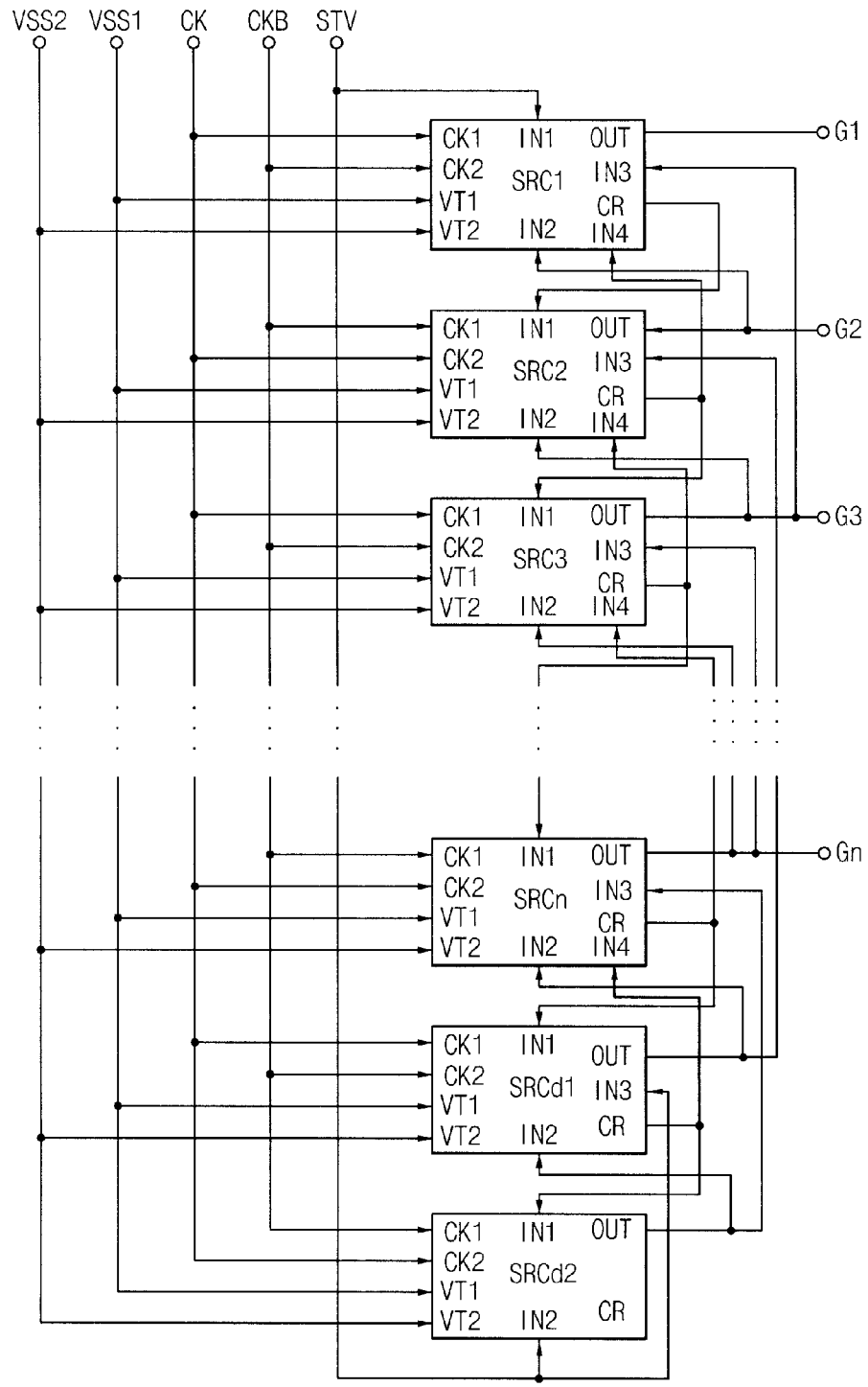
FIG. 8 is a schematic circuit diagram illustrating an alternative exemplary embodiment of a gate drive circuit according to the present invention.

FIG. 8 is a schematic circuit diagram illustrating an alternative exemplary embodiment of agate drive circuit.

The circuit diagram in FIG. 8 is substantially the same as the circuit diagram shown in FIG. 2 except for a forth input terminal IN4. The same or like elements shown in FIG. 8 have been labeled with the same reference characters as used above to describe the exemplary embodiments of the gate drive circuit 200 shown in FIG. 2, and any repetitive detailed description thereof will hereinafter be omitted or simplified.

As shown in FIGS. 2 and 8, an exemplary embodiment of the gate drive circuit 200 may include stages cascaded together, for example, n driving stages SRC1 to SRCn and two dummy stages including a first dummy stage SRCd1 and a second dummy stage SRCd2. The n driving stages SRC1 to SRCn are respectively connected to n gate lines G1 to Gn to output gate signals to the n gate lines G1 to Gn.

Each of the stages may include a first clock terminal CK1, a second clock terminal CK2, a first input terminal IN1, a second input terminal IN2, a third input terminal IN3, a fourth input terminal IN4, a first voltage terminal VT1, a second voltage terminal VT2, a carry terminal CT and an output terminal OUT.

The fourth input terminal IN4 of each of the stages is electrically connected to a carry terminal CR of a subsequent stage of each of the stages, to receive a carry signal output from the carry terminal CR.

Figure 9:
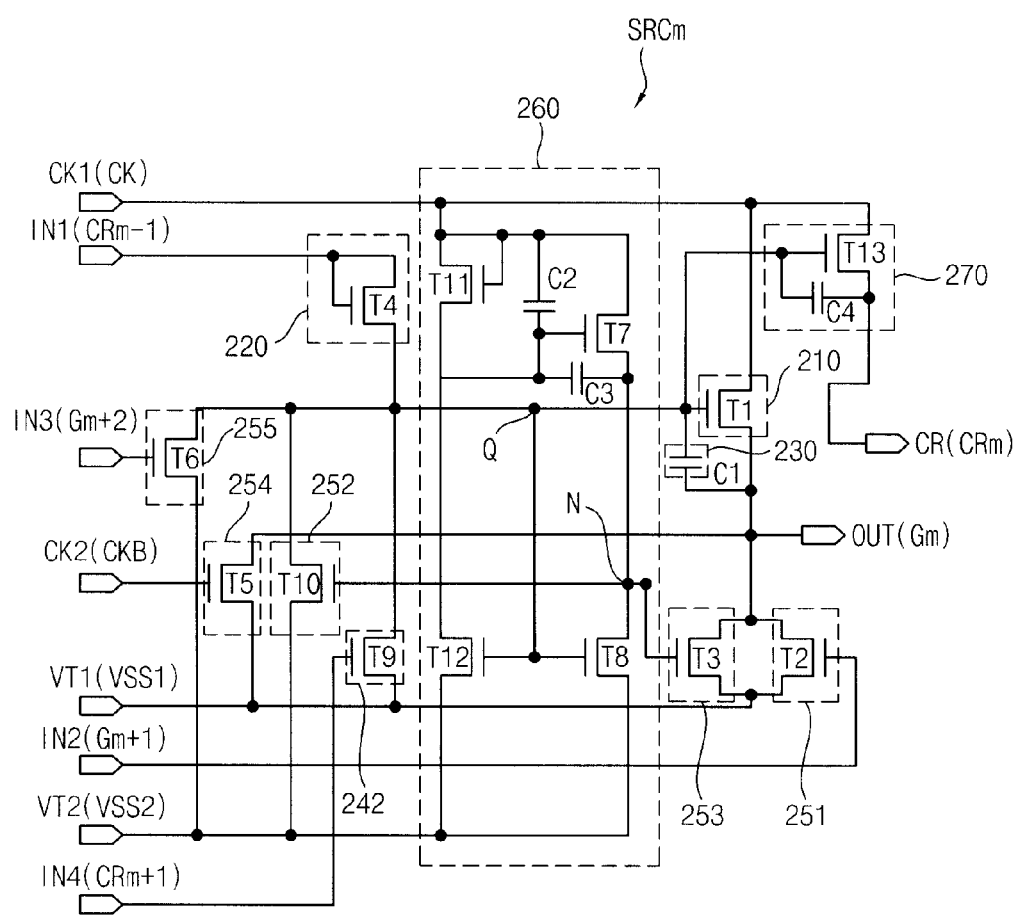
FIG. 9 is a schematic circuit diagram illustrating an alternative exemplary embodiment of an m-th stage of the gate drive circuit shown in FIG. 8.

FIG. 9 is a schematic circuit diagram illustrating an exemplary embodiment of an m-th stage of the gate drive circuit shown in FIG. 8.

The circuit diagram in FIG. 9 is substantially the same as the circuit diagram shown in FIG. 3 except for a discharging part 242. The same or like elements shown in FIG. 9 have been labeled with the same reference characters as used above to describe the exemplary embodiments of the m-th stage shown in FIG. 3, and any repetitive detailed description thereof will hereinafter be omitted or simplified.

As shown in FIGS. 8 and 9, the m-th stage SRCm may include an input part, an output part 210, an output driving part, a holding part, a switching part 260 and a carry part 270. The output driving part may include a buffer part 220, a charging part 230 and a discharging part 242. The holding part may include a first holding part 251, a second holding part 252, a third holding part 253, a fourth holding part 254 and a fifth holding part 255.

The discharging part 242 includes a ninth transistor T9. The ninth transistor T9 includes a gate electrode connected to a fourth input terminal IN4, a source electrode connected to the first voltage terminal VT1, and a drain electrode connected to the first node Q. The discharging part 242 discharges a voltage of the first node Q to a level of a first low voltage VSS1 in response to a high level of an (m+1)-th carry signal CRm+1 applied to the fourth input terminal IN4.

Figure 10:
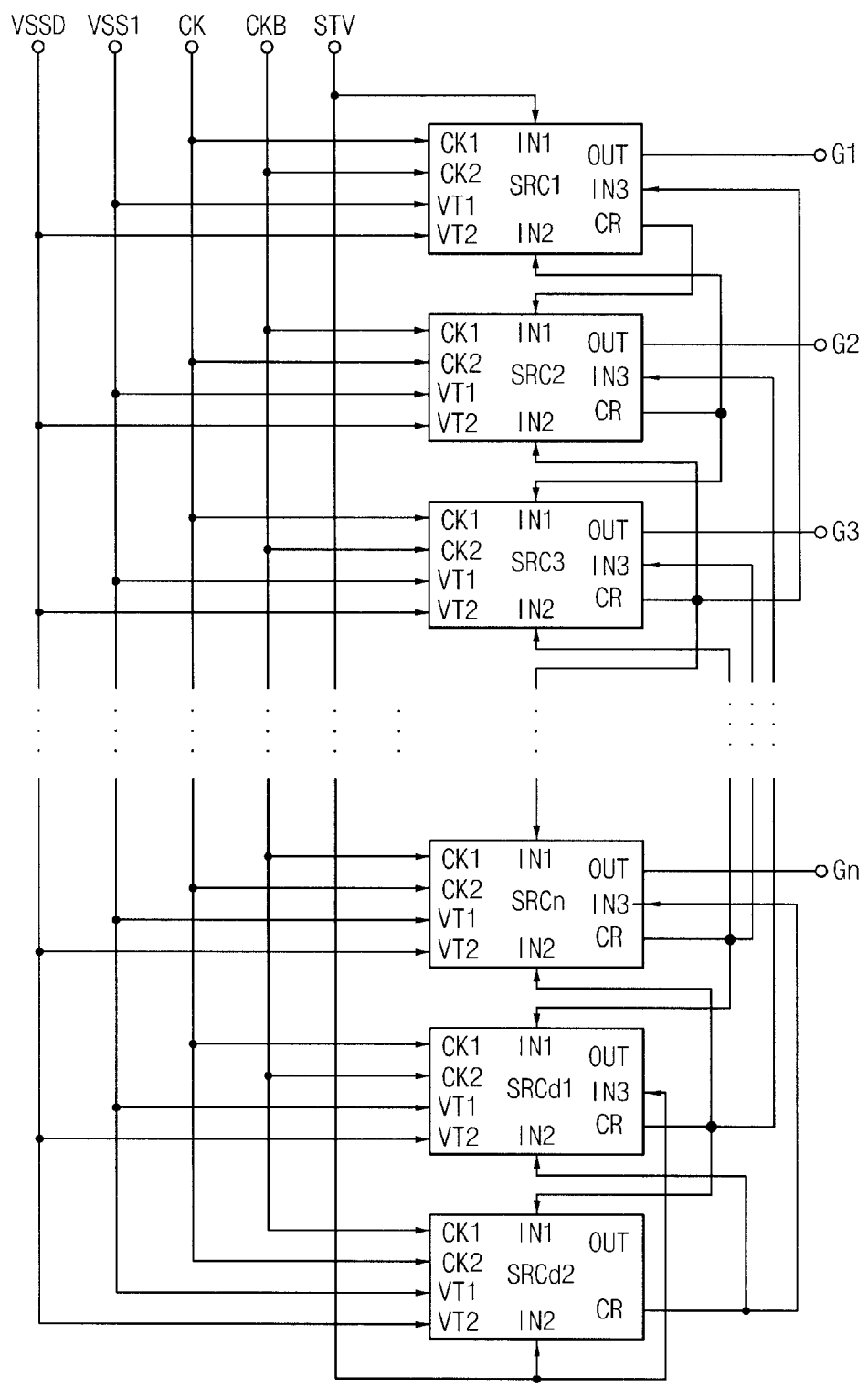
FIG. 10 is a block diagram illustrating an alternative exemplary embodiment of a gate drive circuit according to the present invention.

In an exemplary embodiment, the gate drive circuit receives the (m+1)-th carry signal CRm+1 as a control signal of the discharging part 242, and thereby a leakage current flowing into the first node Q through the discharging part 242 is substantially minimized FIG. 10 is a block diagram illustrating an alternative exemplary embodiment of a gate drive circuit 200.

The block diagram in FIG. 10 is substantially the same as the block diagram shown in FIG. 2 except for a signal applied to the second input terminal IN2 and the third input terminal IN3. The same or like elements shown in FIG. 10 have been labeled with the same reference characters as used above to describe the exemplary embodiments of the gate drive circuit shown in FIG. 2, and any repetitive detailed description thereof will hereinafter be omitted or simplified.

As shown in FIG. 10, an exemplary embodiment of the gate drive circuit 200 may include stages cascaded together, for example, n driving stages SRC1 to SRCn and two dummy stages including a first dummy stage SRCd1 and a second dummy stage SRCd2. The n driving stages SRC1 to SRCn are connected to n gate lines G1 to Gn, respectively, to output gate signals to the n gate lines G1 to Gn. The two dummy stages SRCd1 and SRCd2 are cascaded to the n-th driving stage SRCn.

Each of the n driving stages SRC1 to SRCn and the first dummy stage SRCd1 may include a first clock terminal CK1, a second clock terminal CK2, a first input terminal IN1, a second input terminal IN2, a third input terminal IN3, a first voltage terminal VT1, a second voltage terminal VT2, a carry terminal CR and an output terminal OUT. The second dummy stage may include a first clock terminal CK1, a second clock terminal CK2, a first input terminal IN1, a second input terminal IN2, a first voltage terminal VT1, a second voltage terminal VT2, a carry terminal CR and an output terminal OUT.

The second input terminal IN2 of each of the stages receives a carry signal from a first subsequent stage of each of the stages, which is one of the stages subsequent each of the stages, or a vertical start signal STV. A second input terminal IN2 of each of the n driving stages SRC1 to SRCn and the first dummy stage SRCd1 may receive a gate signal of the first subsequent stage, for example, SRC2 to SRCd2 respectively, and the second input terminal IN2 of the second dummy stage SRCd2 may receive the vertical start signal STV.

The third input terminal IN3 of each of stages receives a carry signal of a second subsequent stage of each of the stages subsequent to the first subsequent stage that provides a carry signal to a second input terminal IN2 of each of the stages or the vertical start signal STV. In an exemplary embodiment, when a second input terminal of a k-th stage receives a carry signal of a (k+1)-th stage, a third input terminal IN3 of the k-th stage may receive a carry signal of a (k+2)-th stage. A third input terminals IN3 of each of the n driving stages SRC1 to SRCn receive a carry signal of the second subsequent stage of each of stages, and the third input terminal IN3 of the first dummy stage SRCd1 receives the vertical start signal STV.

The first voltage terminal VT1 receives a first low voltage VSS1. The first low voltage VSS1 may be about −6 V.

The second voltage terminal VT2 receives a dynamic low voltage VSSD. The dynamic low voltage VSSD may include a low voltage of a first level and a low voltage of a second level. In an exemplary embodiment, the dynamic low voltage VSSD includes a low voltage of the first level at room temperature, and includes a low voltage of the second level at a high temperature. In an exemplary embodiment, the low voltage of the first level may be about −6 V that is substantially equal to the first low voltage VSS1, and the low voltage of the second level may be about −11 V that is substantially lower than the low voltage of the first level.

Figure 11:
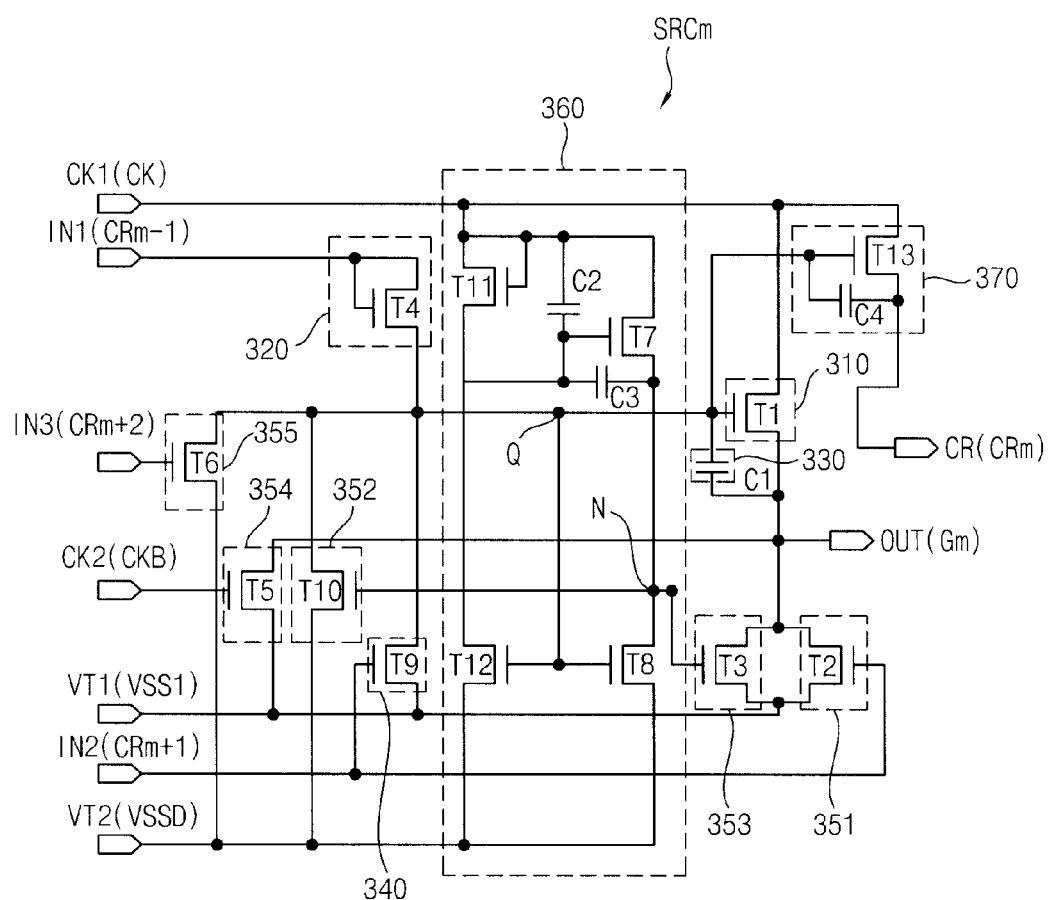
FIG. 11 is a schematic circuit diagram illustrating an alternative exemplary embodiment of an m-th stage of the gate drive circuit shown in FIG. 10.

FIG. 11 is a schematic circuit diagram illustrating an exemplary embodiment of an m-th stage of the stages in FIG. 10.

As shown in FIGS. 10 and 11, the m-th stage SRCm may include an input part, an output part 310, an output driving part, a holding part, a switching part 360 and a carry part 370. The output driving part may include a buffer part 320, a charging part 330 and a discharging part 340. The holding part may include a first holding part 351, a second holding part 352, a third holding part 353, a fourth holding part 354 and a fifth holding part 355.

The output part 310 includes a first transistor T1. The first transistor T1 includes a drain electrode connected to a first clock terminal CK1, a gate electrode connected to a first node Q, and a source electrode connected to the output terminal OUT. The output part 310 outputs the first clock signal CK as a gate signal, which is applied through the first clock terminal CK1 when a high voltage is applied through the first node Q.

The buffer part 320 includes a fourth transistor T4. The fourth transistor T4 includes a gate electrode and a drain electrode that are connected to a first input terminal IN1, and a source electrode connected to the first node Q.

The charging part 330 includes a first capacitor including a first electrode connected to the first node Q and a second electrode connected to an output terminal OUT. The charging part 330 is charged by a high voltage of the first input signal applied to the first input terminal IN1 to maintain a voltage of the first node Q at a high voltage.

The discharging part 340 includes a ninth transistor T9. The ninth transistor T9 includes a gate electrode connected to the second input terminal IN2, a source electrode connected to the first voltage terminal VT1, and a drain electrode connected to the first node Q. The discharging part 340 discharges a voltage of the first node Q to a level of the first low voltage VSS1 in response to a high voltage of an (m+1)-th carry signal CRm+1 output from an (m+1)-th stage applied to the second input terminal IN2.

The first holding part 351 includes a second transistor T2. The second transistor T2 includes a gate electrode connected to the second input terminal IN2, a source electrode connected to the first voltage terminal VT1, and a drain electrode connected to the output terminal OUT. The first holding part 351 applies the first low voltage VSS1 applied to the first voltage terminal VT1 to the output terminal OUT in response to the (m+1)-th carry signal CRm+1 applied to the second input terminal IN2.

The second holding part 352 includes a tenth transistor T10. The tenth transistor T10 includes a gate electrode connected to a second node N, a source electrode connected to the second voltage terminal VT2 and a drain electrode connected to the first node Q. The second holding part 352 maintains a voltage of the first node Q at a dynamic low voltage VSSD applied to the second voltage terminal VT2 in response to a signal of the second node N. The dynamic low level VSSD has a low voltage of a first level at room temperature, and has a low voltage of a second level that is lower than the first level at a high temperature, where the high temperature is substantially higher than the room temperature. In an exemplary embodiment, the first level may be about −6 V that is substantially equal to the first low voltage VSS1, and the second level may be about −11 V that is substantially lower than the first level.

The third holding part 353 includes a third transistor T3. The third transistor T3 includes a gate electrode connected to the second node N, a source electrode connected to the first voltage terminal VT1, and a drain electrode connected to the output terminal OUT. The third holding part 353 maintains a voltage of the output terminal OUT at the first low voltage VSS1 in response to a high voltage applied to the second node N.

The fourth holding part 354 includes a fifth transistor T5. The fifth transistor T5 includes a gate electrode connected to a second clock terminal CK2, a source electrode connected to the first voltage terminal VT1, and a drain electrode connected to the output terminal OUT. The fourth holding part 354 maintains a voltage of the output terminal OUT at the first low voltage VSS1 in response to a second clock signal CKB.

The fifth holding part 355 includes a sixth transistor T6. The sixth transistor T6 includes a gate electrode connected to a third input terminal IN3, a source electrode connected to the second voltage terminal VT2, and a drain electrode connected to the first node Q. The fifth holding part 355 applies the dynamic low voltage VSSD to the first node Q in response to an (m+2)-th carry signal CRm+2 output from an (m+2)-th stages received at the third input terminal IN3.

The switching part 260 may include a seventh transistor T7, an eighth transistor T8, an eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2, and a source electrode connected to the second node N. The third capacitor C3 is connected to the gate electrode and the source electrode of the seventh transistor T7.

The eighth transistor T8 includes a gate electrode connected to the first node Q, a drain electrode connected to the second node N, and a source electrode connected to the second voltage terminal VT2.

The eleventh transistor T11 includes a source electrode connected to a drain electrode of the twelfth transistor T12, and a gate electrode and a drain electrode that are connected to the first clock terminal CK1.

The twelfth transistor T12 includes a gate electrode connected to the first node Q, a drain electrode connected to the source electrode of the eleventh transistor T11, and a source electrode connected to the second voltage terminal VT2.

While a high voltage is applied to the first node Q in one frame, the twelfth and eighth transistors T12 and T8 of the switching part 360 are turned on, and thereby a voltage of the second node N is discharged to the second low voltage VSS2. While a low voltage is applied to the first node Q, the twelfth and eighth transistors T12 and T8 of the switching part 260 are turned off, and thereby an equal signal having a phase substantially equal to a phase of the first clock signal CK received by the first clock terminal CK1 is applied to the second node N. When a voltage of the second node N is converted into a high level, the third transistor T3 is turned on so that the output terminal OUT is discharged to the first low voltage VSS1.

The carry part 370 includes a thirteenth transistor T13. The thirteenth transistor T15 includes a gate electrode connected to the first node Q, a source electrode connected to a carry terminal CR, and a drain electrode connected to the first clock terminal CK1. The carry part 370 may further include a fourth capacitor C4 connected to the gate electrode and the source electrode of the thirteenth transistor T13. When a voltage of the first node Q is converted into a high level, the carry terminal 280 outputs a high level of the first clock signal CK as a carry signal.

In an exemplary embodiment, the gate drive circuit receives a carry signal that is not a gate signal as a control signal of the discharging part 340 and the fifth holding part 355, and thereby a leakage current flowing into the first node Q through the discharging part 340 and the fifth holding part 355 is substantially minimized, and deteriorations of the discharging part 340 and the fifth holding part 355 are substantially prevented when a gate drive circuit is driven for a long time.

In an exemplary embodiment, a voltage of the first node Q is applied as a dynamic low voltage VSSD having a second level that is lower than the first low voltage VSS1 applied to the first voltage terminal VT1 when the gate drive circuit is driven at a high temperature, and thereby a gate-source voltage $V_{GS}$ of the first transistor T1 may be set at a negative voltage to remove high temperature noise of a gate signal.

Figure 12:
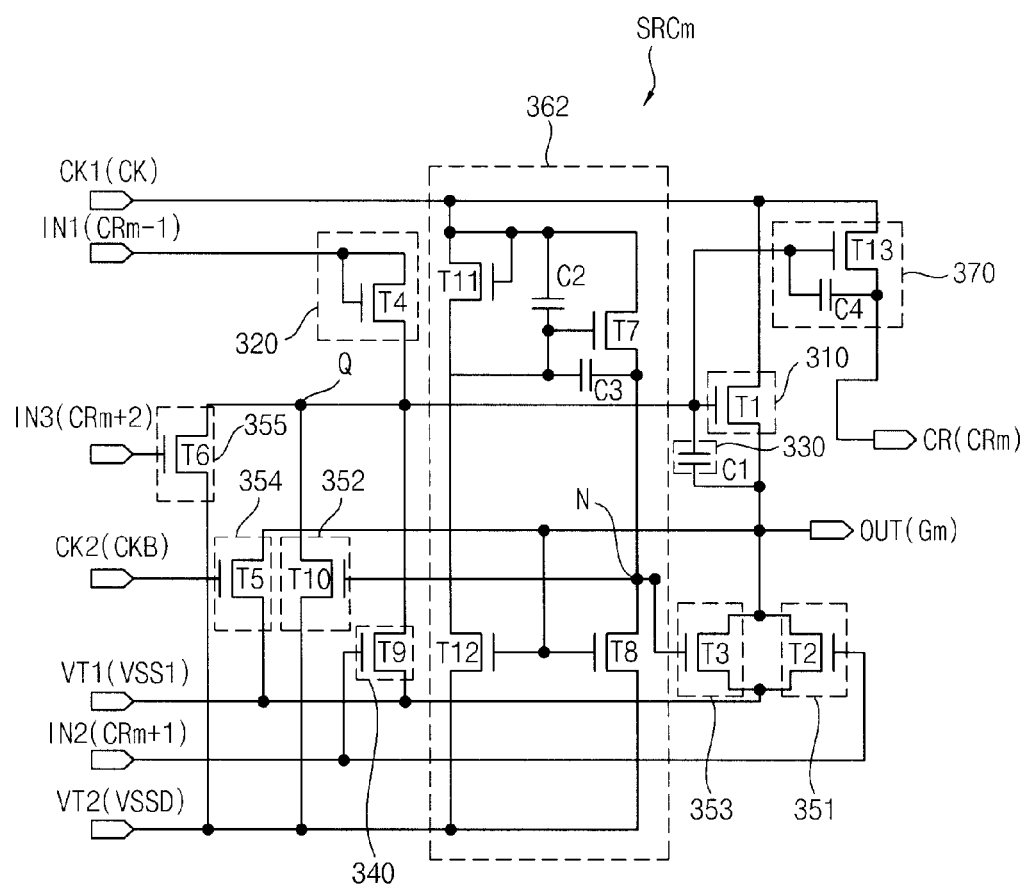
FIG. 12 is a schematic circuit diagram illustrating an alternative exemplary embodiment of an m-th stage according to the present invention.

FIG. 12 is a schematic circuit diagram illustrating an alternative exemplary embodiment of an m-th stage.

The circuit diagram in FIG. 12 is substantially the same as the circuit diagram shown in FIG. 11 except for a switching part 362. The same or like elements shown in FIG. 12 have been labeled with the same reference characters as used above to describe the exemplary embodiments of the m-th stage shown in FIG. 11, and any repetitive detailed description thereof will hereinafter be omitted or simplified.

As shown in FIG. 12, the m-th stage SRCm may include an input part, an output part 310, an output driving part, a holding part, a switching part 362 and a carry part 370. The output driving part may include a buffer part 320, a charging part 330 and a discharging part 340. The holding part may include a first holding part 351, a second holding part 352, a third holding part 353, a fourth holding part 354 and a fifth holding part 355.

The switching part 362 may include a seventh transistor T7, an eighth transistor T8, an eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2, and a source electrode connected to the second node N. The third capacitor C3 is connected to the gate electrode and source electrode of the seventh transistor T7.

The eighth transistor T8 includes a gate electrode connected to the output terminal OUT, a drain electrode connected to the second node N, and a source electrode connected to the second voltage terminal VT2.

The eleventh transistor T11 includes a gate electrode and a drain electrode that are connected to the first clock terminal CK1, and a source electrode connected to the drain electrode of the twelfth transistor T12.

The twelfth transistor T12 includes a gate electrode connected to the output terminal OUT, and a source electrode connected to the second voltage terminal VT2.

While the m-th gate signal Gm is maintained at a high voltage in one frame, the twelfth and eighth transistors T12 and T8 of the switching part 362 are turned on, and thereby a voltage of the second node N is discharged to the second low voltage VSS2. Since the third transistor T3 is in a turned-off state, the first voltage terminal VT1 is electrically isolated from the output terminal OUT of the m-th stage. Thus, the m-th gate signal is not discharged to the first low voltage VSS1, and is substantially fully output through the output terminal OUT.

While the m-th gate signal Gm is maintained at a low voltage in one frame, the twelfth and eighth transistors T12 and T8 of the switching part 362 are turned off, and thereby an equal signal having a phase substantially equal to a phase of the first clock signal CK received by the first clock terminal CK1 is applied to the second node N. When a voltage of the second node N is converted into a high level, the third transistor T3 is turned on, and thereby the first low voltage VSS1 is applied to the output terminal OUT.

In an exemplary embodiment, when a gate drive circuit is driven at a high temperature, a gate-source voltage $V_{GS}$ of the first transistor T1 may be set as a negative voltage during an interval in which the m-th gate signal Gm is maintained at a low voltage for one frame to remove high temperature noise.

Figure 13:
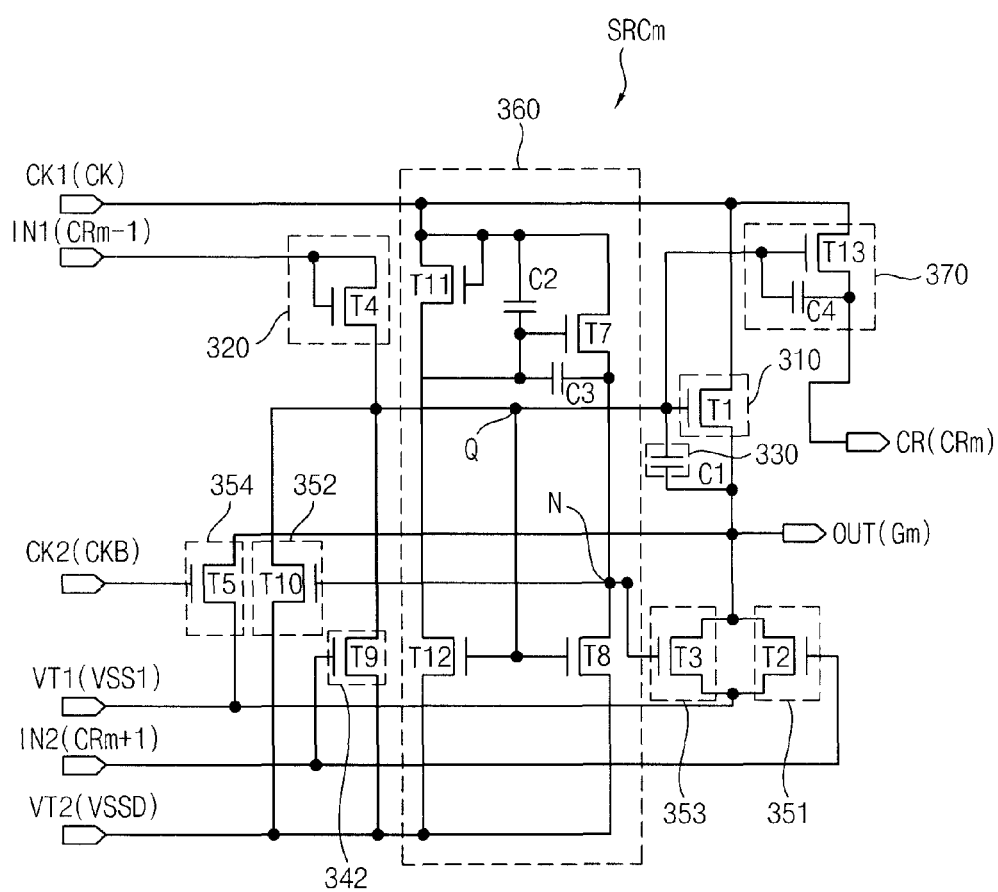
FIG. 13 is a schematic circuit diagram illustrating an alternative exemplary embodiment of an m-th stage according to the present invention.

FIG. 13 is a schematic circuit diagram illustrating an alternative exemplary embodiment of an m-th stage.

The circuit diagram in FIG. 13 is substantially the same as the circuit diagram shown in FIG. 11 except for a fifth holding part 355 and a connection structure of a switching element included in a discharging part 342. The same or like elements shown in FIG. 13 have been labeled with the same reference characters as used above to describe the exemplary embodiments of the m-th stage shown in FIG. 11, and any repetitive detailed description thereof will hereinafter be omitted or simplified.

As shown in FIG. 13, the m-th stage SRCm may include an input part, an output part 310, an output driving part, a holding part, a switching part 360 and a carry part 370. The output driving part may further include a buffer part 320, a charging part 330 and a discharging part 342. The holding part may include a first holding part 351, a second holding part 352, a third holding part 353 and a fourth holding part 354.

The discharging part 342 includes a ninth transistor T9. The ninth transistor T9 includes a gate electrode connected to a second input terminal IN2, a source electrode connected to a second voltage terminal VT2, and a drain electrode connected to a first node Q. The discharging part 342 discharges a voltage of the first node Q to a level of a dynamic low voltage VSSD applied to a second voltage terminal VT2 in response to an (m+1)-th carry signal CRm+1 of an (m+1)-th stage, applied to the second input terminal IN2. The dynamic low voltage VSSD includes a low voltage of a first level at room temperature, and includes a low voltage of a second level that is lower than the first level at a high temperature. In an exemplary embodiment, the first level is about −6 V, and the second level is about −11 V.

When the gate drive circuit is operated at a high temperature, while the m-th gate signal Gm is maintained at a low voltage in one frame, the first node Q connected to a gate electrode of the first transistor T1 is maintained at a low voltage of the second level, and the output terminal OUT connected to a source electrode of the first transistor T1 is maintained at a first low voltage VSS1 applied from the first voltage terminal VT1.

In an exemplary embodiment, when a gate drive circuit is operated at a high temperature, a gate-source voltage $V_{GS}$ of the first transistor T1 may be set as a negative voltage during an interval in which the m-th gate signal Gm is maintained at a low voltage for one frame, so that high temperature noise may be removed.

Figure 14:
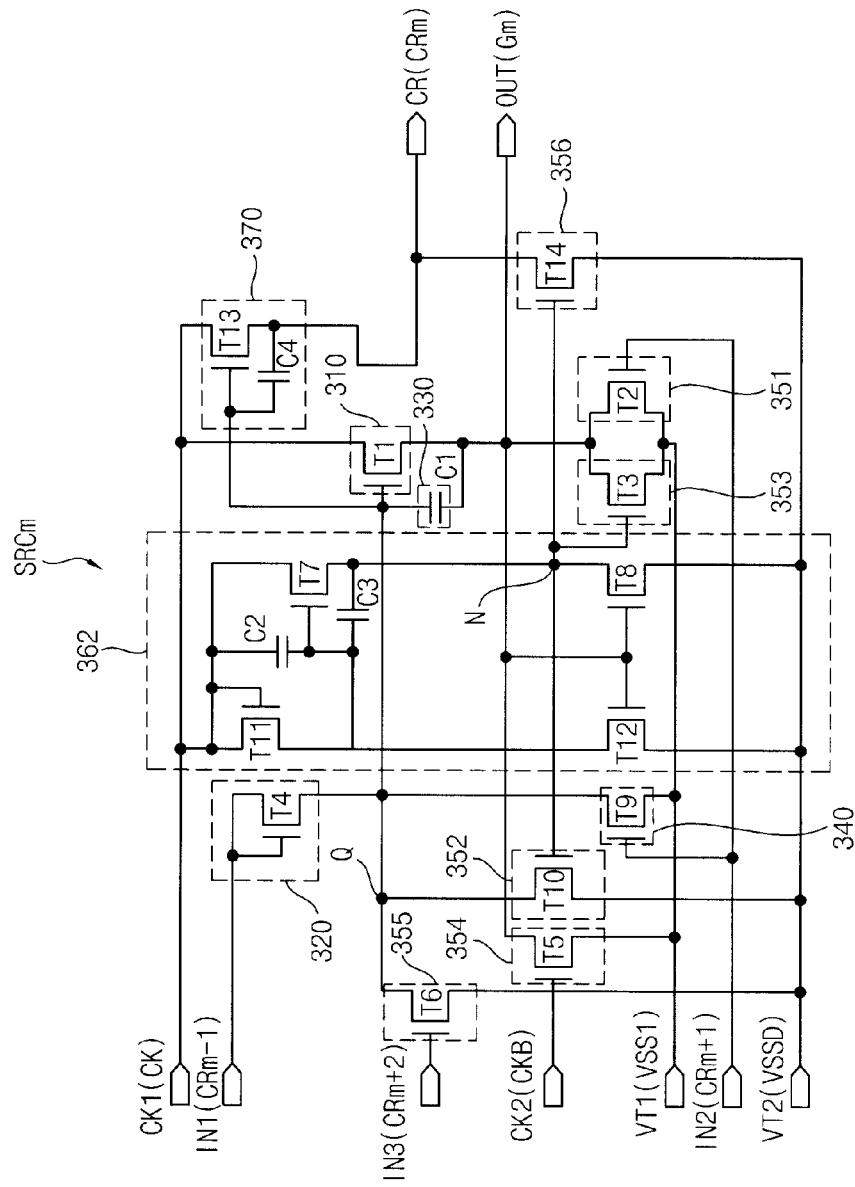
FIG. 14 is a schematic circuit diagram illustrating an alternative exemplary embodiment of an m-th stage according to the present invention.

FIG. 14 is a schematic circuit diagram illustrating an alternative exemplary embodiment an m-th stage.

Each of the stages in FIG. 14 is substantially the same as each of the stages shown in FIG. 12 except for a sixth holding part 356. The same or like elements shown in FIG. 14 have been labeled with the same reference characters as used above to describe the exemplary embodiments of each of the stages shown in FIG. 12, and any repetitive detailed description thereof will hereinafter be omitted or simplified.

As shown in FIG. 14, the m-th stage SRCm may include an input part, an output part 310, an output driving part, a holding part, a switching part 360 and a carry part 370. The output driving part may include a buffer part 320, a charging part 330 and a discharging part 340. The holding part may include a first holding part 351, a second holding part 352, a third holding part 353, a fourth holding part 354, a fifth holding part 355 and a sixth holding part 356.

The sixth holding part 356 includes a fourteenth transistor T14. The fourteenth transistor T14 includes a gate electrode connected to a second node N, a source electrode connected to a second voltage terminal VT2, and a drain electrode connected to a carry terminal CR. The sixth holding part 356 maintains a carry signal CRm of the carry terminal CR at a dynamic low voltage VSSD applied to the second voltage terminal VT2 in response to a signal of the second node N while an m-th gate signal Gm is at a low voltage. The dynamic low voltage VSSD includes a low voltage of a first level at room temperature, and includes a low voltage of a second level that is lower than the first level at a high temperature. In an exemplary embodiment, the first level is about −6 V that is substantially equal to the first low voltage VSS1 applied to a first voltage terminal VT1, and the second level is about −11 V that is lower than the first level.

The sixth holding part 356 may stably maintain the carry signal CRm at the dynamic low voltage VSSD except for an interval in which the m-th gate signal Gm is at a high voltage and the first clock signal CK is at a high voltage.

In an exemplary embodiment, a carry signal applied to a subsequent stage of the m-th stage is stably maintained at a low voltage during remaining intervals except for an interval in which a corresponding gate signal is maintained at a high voltage through the sixth holding part 356, and thereby a ripple generated due to the carry signal is substantially decreased.

Figure 15:
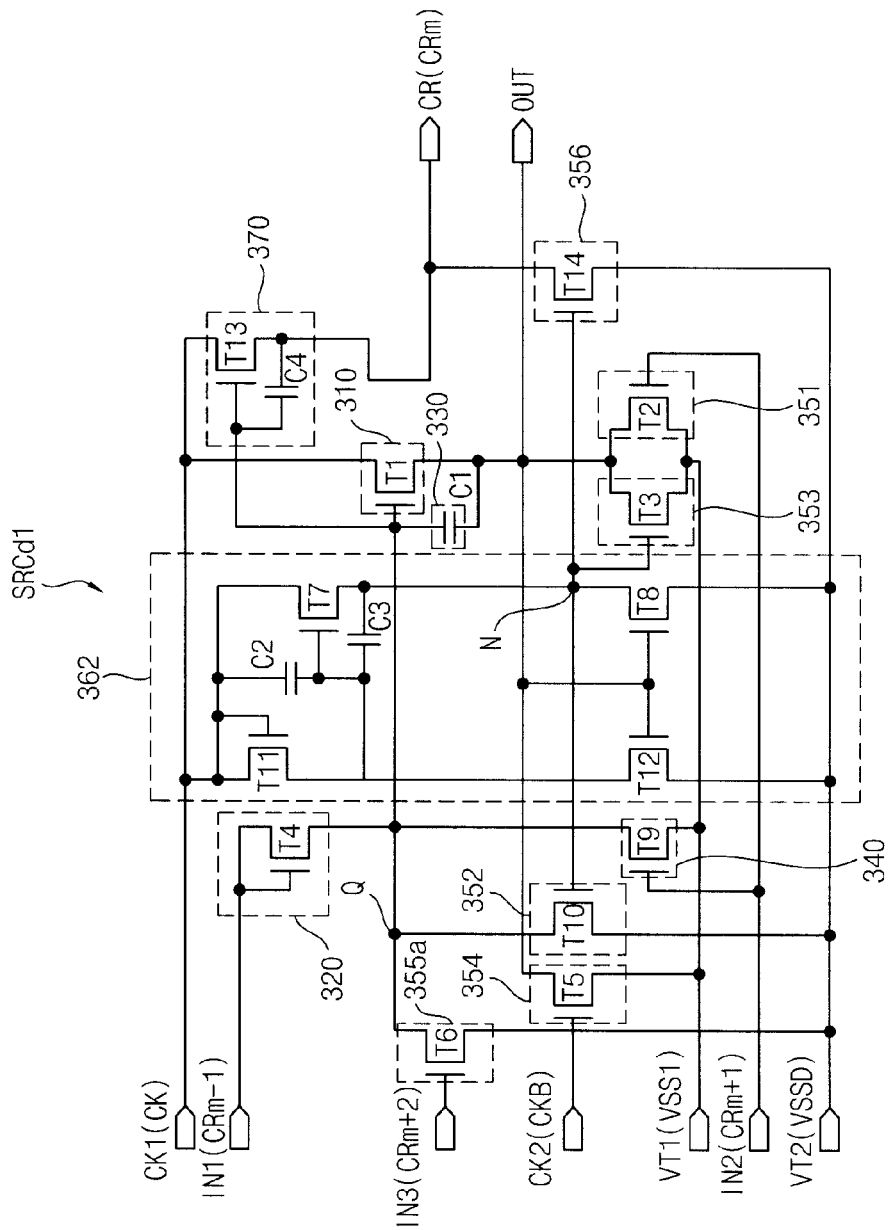
FIG. 15 is a schematic circuit diagram illustrating an exemplary embodiment of a first dummy stage of the gate drive circuit shown in FIG. 10.

FIG. 15 is a schematic circuit diagram illustrating an exemplary embodiment of the first dummy stage SRCd1 of FIG. 10.

The circuit diagram in FIG. 15 is substantially the same as the circuit diagram shown in FIG. 14 except for a fifth holding part 355a. The same or like elements shown in FIG. 15 have been labeled with the same reference characters as used above to describe the exemplary embodiments of the m-th stage shown in FIG. 14, and any repetitive detailed description thereof will hereinafter be omitted or simplified.

As shown in FIGS. 10 and 15, the first dummy stage SRCd1 may include an input part, an output part 310, an output driving part, a holding part, a switching part 360 and a carry part 370. The output driving part may include a buffer part 320, a charging part 330 and a discharging part. The holding part may include a first holding part 351, a second holding part 352, a third holding part 353, a fourth holding part 354, a fifth holding part 355a and a sixth holding part 356.

The fifth holding part 355a includes a sixth transistor T6. The sixth transistor T6 includes a gate electrode connected to a third input terminal IN3, a source electrode connected to a second voltage terminal VT2, and a drain electrode connected to a first node Q. The fifth holding part 355a maintains a voltage of the first node Q at a dynamic low voltage VSSD applied to the second voltage terminal VT2 in response to a vertical start signal STV applied to the third input terminal IN3.

Figure 16:
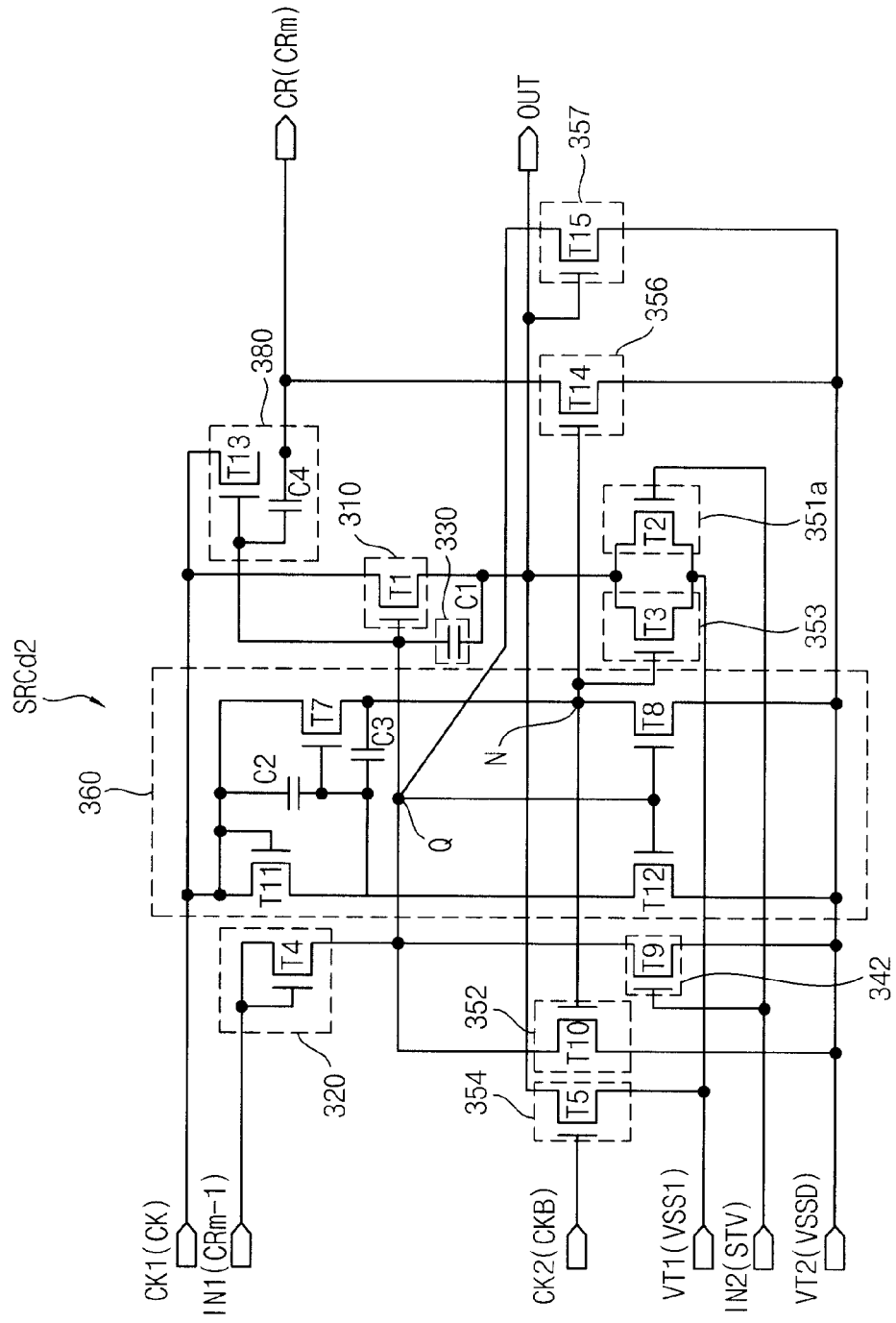
FIG. 16 is a schematic circuit diagram illustrating an exemplary embodiment of a second dummy stage of the gate drive circuit shown in FIG. 10.

FIG. 16 is a schematic circuit diagram illustrating an exemplary embodiment of the second dummy stage SRCd2 of FIG. 10.

The circuit diagram in FIG. 16 is substantially the same as the circuit diagram shown in FIG. 14 except for a discharging part 342. The same or like elements shown in FIG. 16 have been labeled with the same reference characters as used above to describe the exemplary embodiments of the m-th stage shown in FIG. 14, and any repetitive detailed description thereof will hereinafter be omitted or simplified.

As shown in FIGS. 10 and 16, the second dummy stage SRCd2 may include an input part, an output part 310, an output driving part, a holding part, a switching part 360 and a carry part. The output driving part may include a buffer part 320, a charging part 330 and a discharging part 340. The holding part may include a first holding part 351a, a second holding part 352, a third holding part 353, a fourth holding part 354, a fifth holding part 356 and a sixth holding part 357.

The discharging part 342 includes a ninth transistor T9. The ninth transistor T9 includes a gate electrode connected to a second input terminal IN2, a source electrode connected to a second voltage terminal VT2, and a gate electrode connected to a first node Q. The discharging part 342 discharges a voltage of the first node Q to a level of a dynamic low voltage VSSD applied to the second voltage terminal VT2 in response to a vertical start signal STV applied to the second input terminal IN2. The dynamic low level VSSD includes a low voltage of a first level at room temperature, and includes a low voltage of a second level that is substantially lower than the first level at a high temperature that is substantially higher than the room temperature. In an exemplary embodiment, the low voltage of the first level is about −6 V, and the low voltage of the second level is about −11 V The first holding part 351a includes a second transistor T2. The second transistor T2 includes a gate electrode connected to the second input terminal IN2, a source electrode connected to the first voltage terminal VT1, and a drain electrode connected to the output terminal OUT. The first holding part 351a pulls down a voltage of the output terminal OUT to the first low voltage VSS1 in response to the vertical start signal STV applied to the second input terminal IN2.

The fifth holding part 356 includes a fourteenth transistor T14. The fourteenth transistor T14 includes a gate electrode connected to a second node N, a source electrode connected to a second voltage terminal VT2, and a drain electrode connected to a carry terminal CR. The fifth holding part 356 maintains a carry signal CRm output through the carry terminal CR at a dynamic low voltage VSSD applied to the second voltage terminal VT2 in response to a signal of the second node N while an m-th gate signal is at a low voltage.

The sixth holding part 357 includes a fifteenth transistor T15. The fifteenth transistor T15 includes a gate electrode connected to an output terminal OUT, a source electrode connected to the second voltage terminal VT2, and a drain electrode connected to a first node Q. The sixth holding part 357 maintains a signal of the first node Q at the dynamic low voltage VSSD applied to the second voltage terminal VT2 in response to a signal of the output terminal OUT.

Figure 17:
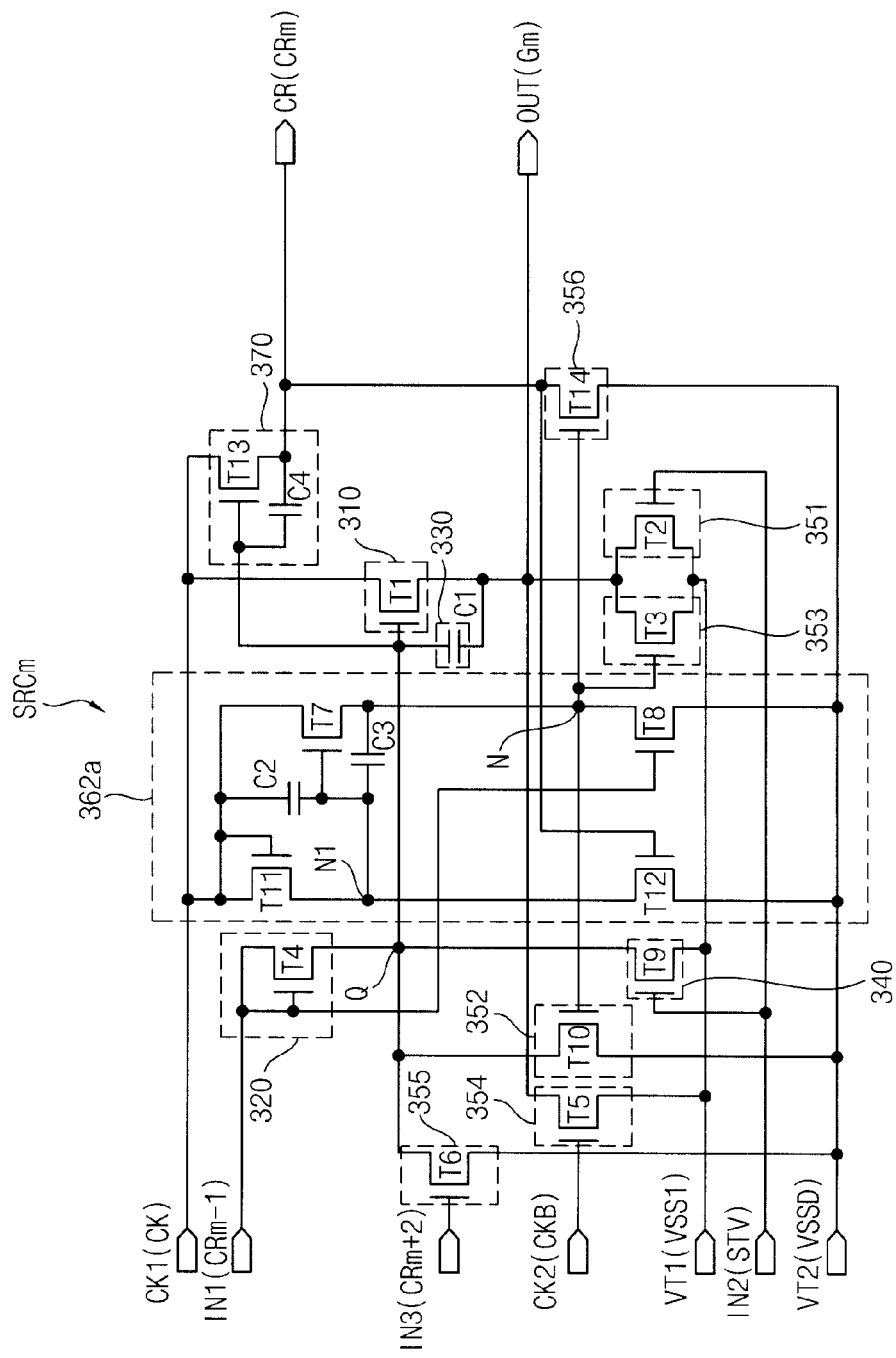
FIG. 17 is a schematic circuit diagram illustrating an alternative exemplary embodiment of an m-th stage according to the present invention.

FIG. 17 is a schematic circuit diagram illustrating an alternative exemplary embodiment of an m-th stage.

The circuit diagram in FIG. 17 is substantially the same as the circuit diagram shown in FIG. 14 except for a switching part 362a. The same or like elements shown in FIG. 17 have been labeled with the same reference characters as used above to describe the exemplary embodiments of the m-th stage shown in FIG. 14, and any repetitive detailed description thereof will hereinafter be omitted or simplified.

As shown in FIG. 17, the m-th stage SRCm may include an input part, an output part 310, an output driving part, a holding part, a switching part 362a and a carry part 370. The output driving part may include a buffer part 320, a charging part 330 and a discharging part 340. The holding part may include a first holding part 351, a second holding part 352, a third holding part 353, a fourth holding part 354, a fifth holding part 355 and a sixth holding part 356.

The sixth holding part 356 includes a fourteenth transistor T14. The fourteenth transistor T14 includes a gate electrode connected to a second node N, a source electrode connected to a second voltage terminal VT2, and a drain electrode connected to a carry terminal CR. The sixth holding part 356 maintains a carry signal CRm output through the carry terminal Gm at a dynamic low voltage VSSD applied to the second voltage terminal VT2 in response to a signal of the second node N1 while an m-th gate signal Gm is at a low voltage. The dynamic low voltage VSSD includes a low voltage of a first level at room temperature, and includes a low voltage of a second level that is substantially lower than the first level at a high temperature. In an exemplary embodiment, the first level is about −6 V that is substantially equal to the first low voltage VSS1 applied to a first voltage terminal VT1, and the second level is about −11 V that is substantially lower than the first level.

The switching part 362a may include a seventh transistor T7, an eighth transistor T8, a eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2 and a source electrode connected to the second node N. The third capacitor C3 is connected to a gate electrode and a source electrode of the seventh transistor T7.

The eighth transistor T8 includes a gate electrode connected to a first input terminal IN1, a drain electrode connected to the second node N, and a source electrode connected to a second voltage terminal VT2.

The eleventh transistor T11 includes a gate electrode and a drain electrode that are commonly connected to the first clock terminal CK1, and a source electrode connected to the twelfth transistor T12.

The twelfth transistor T12 includes a gate electrode connected to the carry terminal CR, and a source electrode connected to the second voltage terminal VT2.

When the eighth transistor T8 is turned on in response to a (m−1)-th carry signal CRm−1 of an (m−1)-th stage SRCm−1 applied to the first input terminal IN1, a voltage of the second node N is discharged to the dynamic low voltage VSSD applied to the second voltage terminal VT2. When the twelfth transistor T12 is turned on in response to a carry signal CRm of an m-th stage SRCm, a voltage applied between a first clock terminal CK1 and the second voltage terminal VT2 is pulled down by the eleventh transistor T11 and the twelfth transistor T12 to generate a low voltage, and the voltage applied between a first clock terminal CK1 and the second voltage terminal VT2 is applied to a third node N1.

A gate-source voltage $V_{GS}$ of the eighth transistor T8 may be defined as a voltage difference between a voltage of the carry terminal CR and a voltage of the second voltage terminal VT2. While an (m−1)-th gate signal is maintained at a high voltage, the first input terminal IN1 connected to a gate electrode of the eighth transistor T8 is maintained at a high voltage (e.g., about 22 V) of a carry signal CRm−1 of the (m−1)-th stage SRCm−1, and the second voltage terminal VT2 connected to a source electrode of the eighth transistor T8 is maintained at the dynamic low voltage (e.g., about −11 V). Thus, the gate-source voltage $V_{GS}$ of the eighth transistor T8 may be about 33 V (e.g., 22 V−(−11 V)).

While the m-th gate signal is maintained at a high voltage, the carry terminal CR connected to a gate electrode of the twelfth transistor T12 is maintained at a high voltage (e.g., about 22 V) of a first clock signal CK applied to the first clock terminal CK1, and the second voltage terminal VT2 connected to a source electrode of the twelfth transistor T12 is maintained at the dynamic low voltage (e.g., about −11 V). Thus, the gate-source voltage $V_{GS}$ of the twelfth transistor T12 may be about 33 V (e.g., 22 V−(−11 V)).

In an alternative exemplary embodiment, when gate electrodes of the eighth and twelfth transistors T8 and T12, a gate-source voltage of the twelfth transistor T12 may vary. While the m-th gate signal or the (m−1)-th gate signal is at a high voltage, the first node Q connected to the gate electrodes of the eighth and twelfth transistors T8 and T12 is maintained at a high voltage (about 41 V), and the second voltage terminal VT2 connected to a source electrode of the eighth transistor T8 is maintained at the dynamic low voltage (about −11 V). Thus, the gate-source voltage $V_{GS}$ of the eighth and twelfth transistors T8 and T12 may be about 52 V (41 V−(−11 V)). Therefore, when the gate-source voltage of the eighth and twelfth transistors T8 and T12 is at a substantially high voltage, a breakdown may be generated at the gate drive circuit.

In an exemplary embodiment, a carry signal CRm−1 of the (m−1)-th stage SRCm−1 is applied as a control signal of the eighth transistor T8, and a carry signal CRm of an m-th stage SRCm is applied as a control signal of the twelfth transistor T12, and thereby a gate-source voltage of the eighth and twelfth transistors T8 and T12 may be decreased by about 19 V from a gate-source voltage of the eight and twelfth transistors T8 and T12 when a signal of the first node Q is applied as a control signal of the eighth and twelfth transistors T8 and T12. Thus, the gate drive circuit may be driven for a long time.

Figure 18:
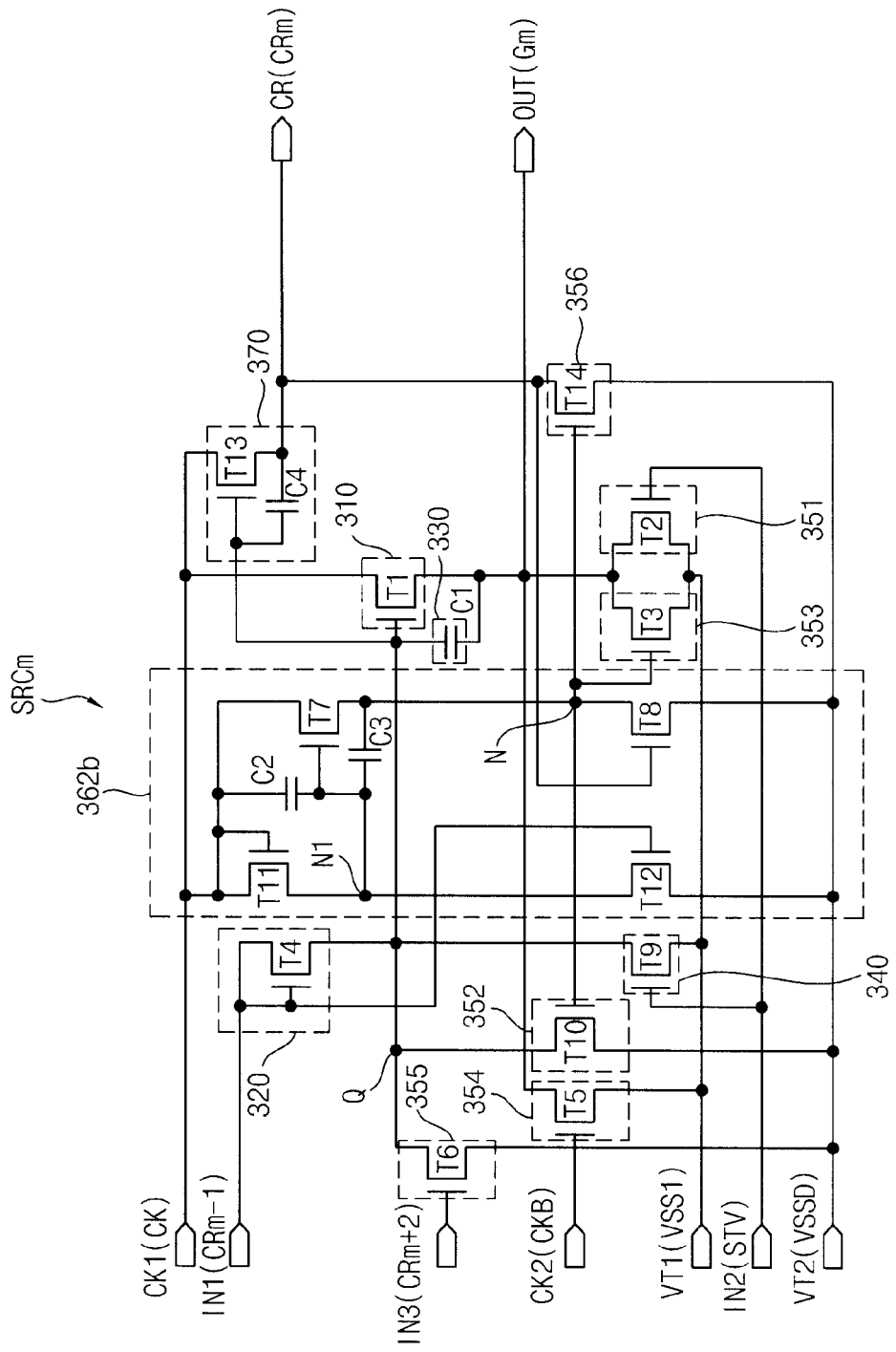
FIG. 18 is a schematic circuit diagram illustrating an alternative exemplary embodiment of an m-th stage according to the present invention.

FIG. 18 is a schematic circuit diagram illustrating an alternative exemplary embodiment of an m-th stage.

The circuit diagram in FIG. 18 is substantially the same as the circuit diagram shown in FIG. 14 except for a switching part 362b. The same or like elements shown in FIG. 18 have been labeled with the same reference characters as used above to describe the exemplary embodiments of the m-th stage shown in FIG. 14, and any repetitive detailed description thereof will hereinafter be omitted or simplified.

As shown in FIG. 18, the m-th stage SRCm may include an input part, an output part 310, an output driving part, a holding part, a switching part 362b and a carry part 370. The output driving part may further include a buffer part 320, a charging part 330 and a discharging part 342. The holding part may include a first holding part 351, a second holding part 352, a third holding part 353, a fourth holding part 354, a fifth holding part 355 and a sixth holding part 356.

The sixth holding part 356 includes a fourteenth transistor T14. The fourteenth transistor T14 includes a gate electrode connected to a second node N, a source electrode connected to a second voltage terminal VT2, and a drain electrode connected to a carry terminal CR. The sixth holding part 356 maintains a carry signal CRm of the carry terminal CR at a dynamic low voltage VSSD applied to the second voltage terminal VT2 in response to a signal of the second node N while an m-th gate signal Gm is at a low voltage. The dynamic low voltage VSSD includes a low voltage of a first level at room temperature, and includes a low voltage of a second level that is lower than the first level at a high temperature. In an exemplary embodiment, the first level is about −6 V that is substantially equal to the first low voltage VSS1 applied to a first voltage terminal VT1, and the second level is about −11 V that is substantially lower than the first level.

The switching part 362b may include a seventh transistor T7, an eighth transistor T8, a eleventh transistor T11, a twelfth transistor T12, a second capacitor C2 and a third capacitor C3.

The seventh transistor T7 includes a drain electrode connected to the first clock terminal CK1, a gate electrode connected to the first clock terminal CK1 through the second capacitor C2, and a source electrode connected to the second node N. The third capacitor C3 is connected to a gate electrode and a source electrode of the seventh transistor T7.

The eighth transistor T8 includes a gate electrode connected to the carry terminal CR, a drain electrode connected to the second node N, and a source electrode connected to the second voltage terminal VT2.

The eleventh transistor T11 includes a gate electrode and a drain electrode that are commonly connected to the first clock terminal CK1, and a source electrode connected to a drain electrode of the twelfth transistor T12.

The twelfth transistor T12 includes a gate electrode connected to a first input terminal IN1, and a source electrode connected to the second voltage terminal VT2.

When the twelfth transistor T12 is turned on in response to a carry signal CRm−1 of an (m−1)-th stage SRCm−1 applied to the first input terminal IN1, a voltage applied between a first clock terminal CK1 and the second voltage terminal VT2 is pulled down by the eleventh transistor T11 and the twelfth transistor T12 to generate a low voltage, and the low voltage is applied to a third node N1. When the eighth transistor T8 is turned on in response to a carry signal CRm of the m-th stage SRCm, a voltage of the second node N is discharged to the dynamic low voltage VSSD applied to the second voltage terminal VT2.

A gate-source voltage $V_{GS}$ of the eighth transistor T8 may be defined as a voltage difference between a voltage of the carry terminal CR and a voltage of the second voltage terminal VT2. While an (m−1)-th gate signal is maintained at a high voltage, the carry terminal CR connected to a gate electrode of the eighth transistor T8 is maintained at a high voltage (e.g., about 22 V) of a first clock signal CK applied to the first clock terminal CK1, and the second voltage terminal VT2 connected to a source electrode of the eighth transistor T8 is maintained at the dynamic low voltage (e.g., about −11 V). Thus, the gate-source voltage $V_{GS}$ of the twelfth transistor T12 may be about 33 V (e.g., 22 V−(−11 V)).

While the (m+1)-th gate signal is maintained at a high voltage, the first input terminal IN1 connected to a gate electrode of the twelfth transistor T12 is maintained at a high voltage (e.g., about 22 V) of a carry signal CRm−1 of the (m−1)-th stage SRCm−1, and the second voltage terminal VT2 connected to a source electrode of the twelfth transistor T12 is maintained at the dynamic low voltage (e.g., about −11 V). Thus, the gate-source voltage $V_{GS}$ of the eighth transistor T8 may be about 33 V (e.g., 22 V−(−11 V)).

In an exemplary embodiment, when a carry signal CRm of the m-th stage SRCm is applied as a control signal of the eighth transistor T8, and a carry signal CRm−1 of an (m−1)-th stage SRCm−1 is applied as a control signal of the twelfth transistor T12, gate-source voltages of the eighth and twelfth transistors T8 and T12 may be substantially lower than gate-source voltages of the eight and twelfth transistors T8 and T12 when a signal of the first node Q is applied as a control signal of the eighth and twelfth transistors T8 and T12, and thereby the gate drive circuit may be driven for a long time.

Figure 19:
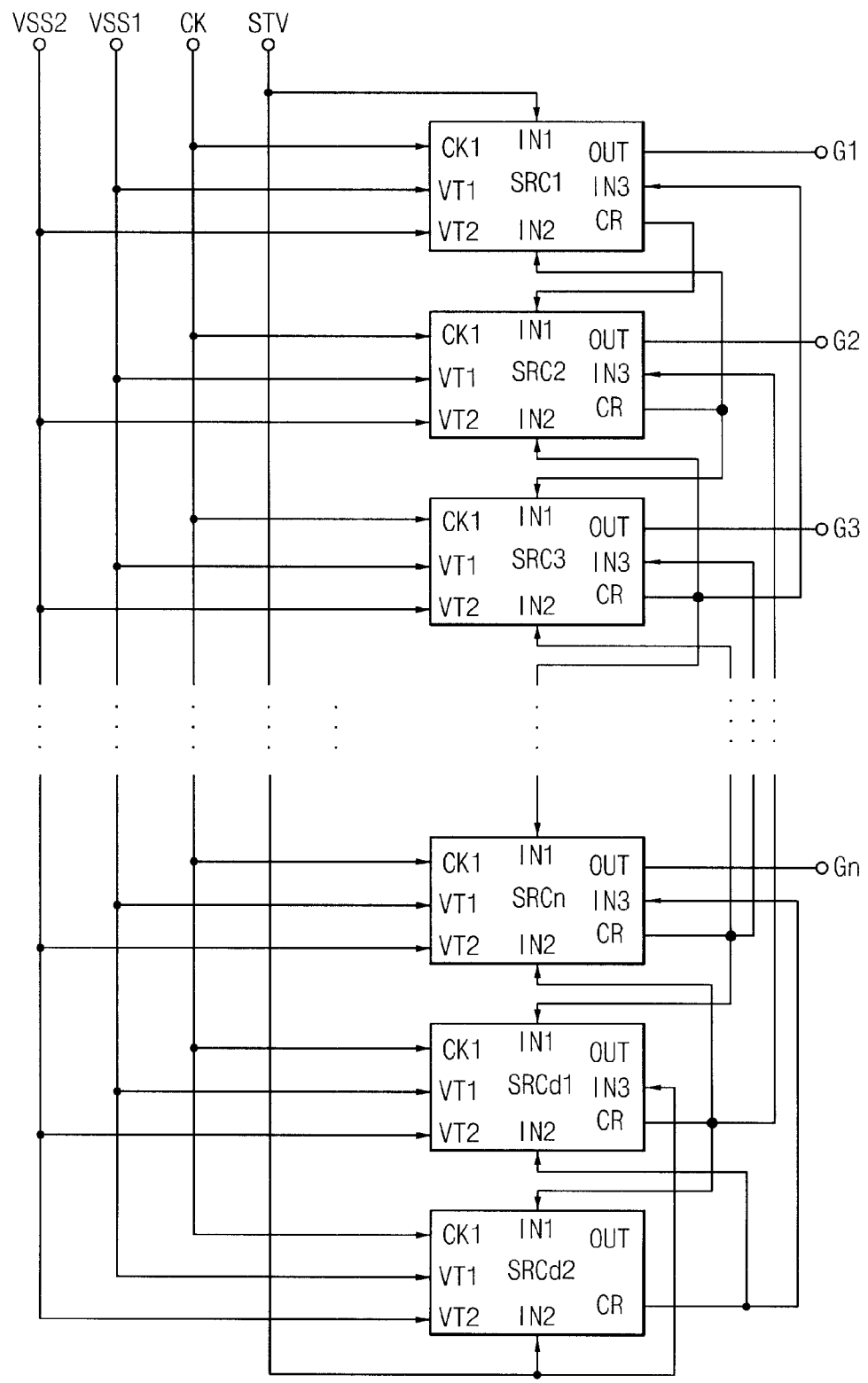
FIG. 19 is a block diagram illustrating an exemplary embodiment of a gate drive circuit according to the present invention.

FIG. 19 is a block diagram illustrating an alternative exemplary embodiment of a gate drive circuit.

As shown in FIG. 19, the gate drive circuit includes a shift register including stages SRC1 to SRCd2 cascaded together. The stages SRC1 to SRCd2 may include n driving stages SRC1 to SRCn and two dummy stages, for example, a first dummy stage SRCd1 and a second dummy stage SRCd2. The n driving stages SRC1 to SRCn are connected to n gate lines G1 to Gn, respectively, to output gate signals to the n gate lines G1 to Gn.

Each of the stages SRC1 to SRCd2 may include a first clock terminal CK1, a first input terminal IN1, a second input terminal IN2, a third input terminal IN3, a first voltage terminal VT1, a second voltage terminal VT2, a carry terminal CR and an output terminal OUT.

The first clock terminal CK1 receives a clock signal CK.

The first input terminal IN1 of each of the stages SRC1 to SRCd2 receives a vertical start signal STV or a carry signal of a previous stage of each of the stages. A first input terminal IN1 of a first stage SRC1 that is stage receives the vertical start signal STV first, and a first input terminal IN1 of each of the stages except for the first stage SRC1, for example, a second stage SRC2 to the second dummy stage SRCd2, receives a carry signal of a previous stage of each of the stages except for the first stage SRC1.

The second input terminal IN2 of each of the stages receives an output signal of a first subsequent stage of the each, which is one of the stages subsequent to each of the stages, or the vertical start signal STV. A second input terminal IN2 of each of the n driving stages SRC1 to SRCn and the first dummy stage SRCd1 receive a gate signal of subsequent stages SRC2 to SRCd2, respectively, and a second input terminal of the second dummy stage SRCd2 receives the vertical start signal STV.

The third input terminal IN3 of each of the stages receives a carry signal of a second subsequent stage of each of the stages subsequent the first subsequent stage that provides a carry signal to a second input terminal IN2 of each of the stages or the vertical start signal STV. In an exemplary embodiment, when a second input terminal IN2 of a n-th stage receives a carry signal of a (n+1)-th stage, a third input terminal IN3 of the n-th stage may receive a carry signal of a (n+2)-th stage. A third input terminals IN3 of each of the n driving stages SRC1 to SRCn receive a carry signal of the second subsequent stage of each of stages, and the third input terminal IN3 of the first dummy stage SRCd1 receives the vertical start signal STV.

The first voltage terminal VT1 receives a first low voltage VSS1. The first low voltage may be about −6 V.

The second voltage terminal VT2 receives a second low voltage VSS2 that is lower than the first low voltage VSS1. The second low voltage VSS2 may be about −11 V.

The carry terminal CR of each of the stages is electrically connected to a first input terminal IN1 of the first subsequent stage of each of the stages to output a carry signal through a first input terminal IN1 of the first subsequent stage.

The output terminal OUT of each of the stages is electrically connected to a gate line to output a gate signal to the gate line. The output terminal OUT is electrically connected to a first input terminal IN1 of the previous stage of each of the stages to provide the first input term terminal IN1 of the previous stage with the gate signal.

Figure 20:
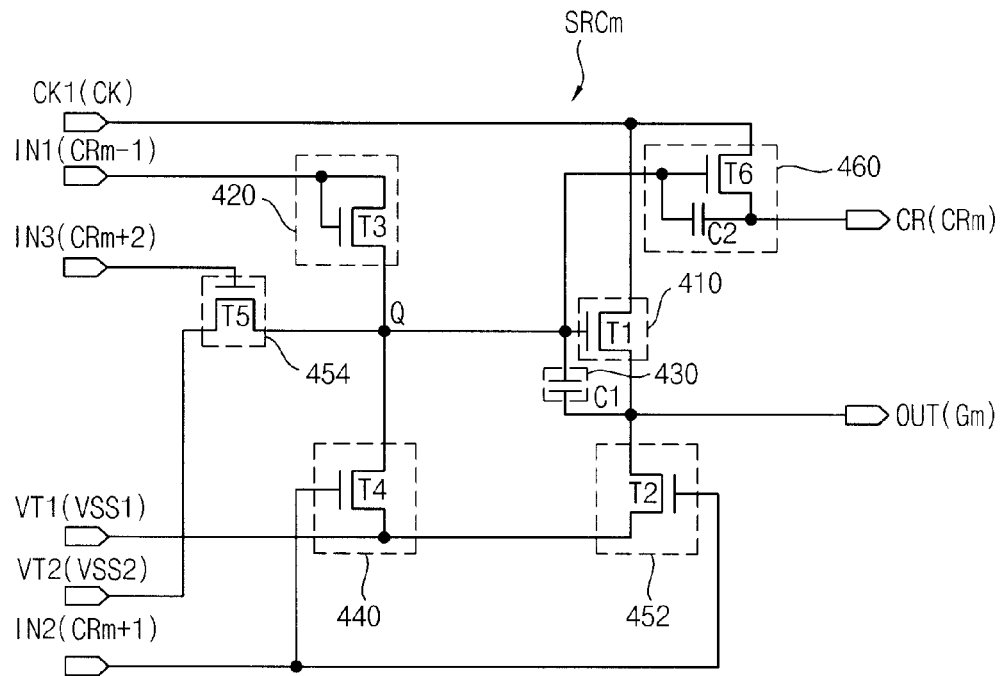
FIG. 20 is a schematic circuit diagram illustrating an alternative exemplary embodiment of an m-th stage of the gate drive circuit shown in FIG. 19.

FIG. 20 is a schematic circuit diagram illustrating an exemplary embodiment of an m-th stage of the stages in FIG. 19.

As shown in FIGS. 19 and 20, the m-th stage SCRm may include an input part, an output part 410 and a holding part. The input part may include a first input terminal IN1 receiving a first input signal, a second input terminal receiving a second input signal and a third input terminal IN3 receiving a third input signal. In an exemplary embodiment, the first input signal is a carry signal CRm−1 of an (m−1)-th stage SRCm−1 or the vertical start signal STV, the second input signal is a gate signal Gm+1 of an (m+1)-th stage SRCm+1, and the third input signal is a gate signal Gm+2 of an (m+2)-th stage SRCm+2.

The output part 410 includes a first transistor T1. The first transistor T1 includes a drain electrode connected to a first clock terminal CK1, a gate electrode connected to a first node Q, and a source electrode connected to the output terminal OUT. The output part 410 outputs a high voltage of the clock signal CK applied through the first clock terminal CK1 as a gate signal in response to a signal of the first node Q.

The m-th stage SRCm may further include an output driving part which turns on the output part 210 in response to the carry signal CRm−1 of the (m−1)-th stage SRCm−1 or the vertical start signal STV, and which turns off the output part 210 in response to the gate signal Gm+1 of the (m+1)-th stage SRCm+1. The output driving part may include a buffer part 420, a charging part 430 and a discharging part 440.

The buffer part 420 includes a third transistor T3. The third transistor T3 includes a gate electrode and a drain electrode that are connected to the first input terminal IN1, and a source electrode connected to the first node Q.

The charging part 430 includes a first capacitor C1 including a first electrode connected to the first node Q and a second electrode connected to the output terminal OUT. The charging part 430 is charged by a high voltage of the first input signal that is applied to the first input terminal IN1 to maintain the first node Q at a high level.

The discharging part 440 includes a fourth transistor T4. The fourth transistor T4 includes a gate electrode connected to the second input terminal IN2, a source electrode connected to the first voltage terminal VT1, and a drain electrode connected to the first node Q.

The holding part may include a first holding part 452 and a second holding part 454.

The first holding part 452 includes a second transistor T2. The second transistor T2 includes a gate electrode connected to the second input terminal IN2, a source electrode connected to the first voltage terminal VT1, and a drain electrode connected to the output terminal OUT. The first holding part 451 pulls down a voltage of the output terminal OUT to the first low voltage VSS1 in response to the gate signal Gm+1 of the (m+1)-th stage SRCm+1, which is applied to the second input terminal IN2.

The second holding part 454 includes a fifth transistor T5. The fifth transistor T5 includes a gate electrode connected to a third input terminal IN3, a source electrode connected to the second voltage terminal VT2, and a drain electrode connected to the first node Q. The second holding part 454 maintains a voltage of the first node Q at a second low voltage VSS2 in response to the (m+2)-th gate signal Gm+2 received by the third input terminal IN3.

The m-th stage SRCm may further include a carry part 460.

The carry part 460 includes a sixth transistor T6. The sixth transistor T6 includes a gate electrode connected to the first node Q, a source electrode connected to a carry terminal CR, and a drain electrode connected to the first clock CK1. The carry part 460 may further include a second capacitor C2 that is connected to the gate electrode of the sixth transistor T6 and the source electrode of the sixth transistor T6. When a voltage of the first node Q is varied to a high level, the carry part 460 outputs a high voltage of the first clock signal CK as a carry signal.

Figure 21:
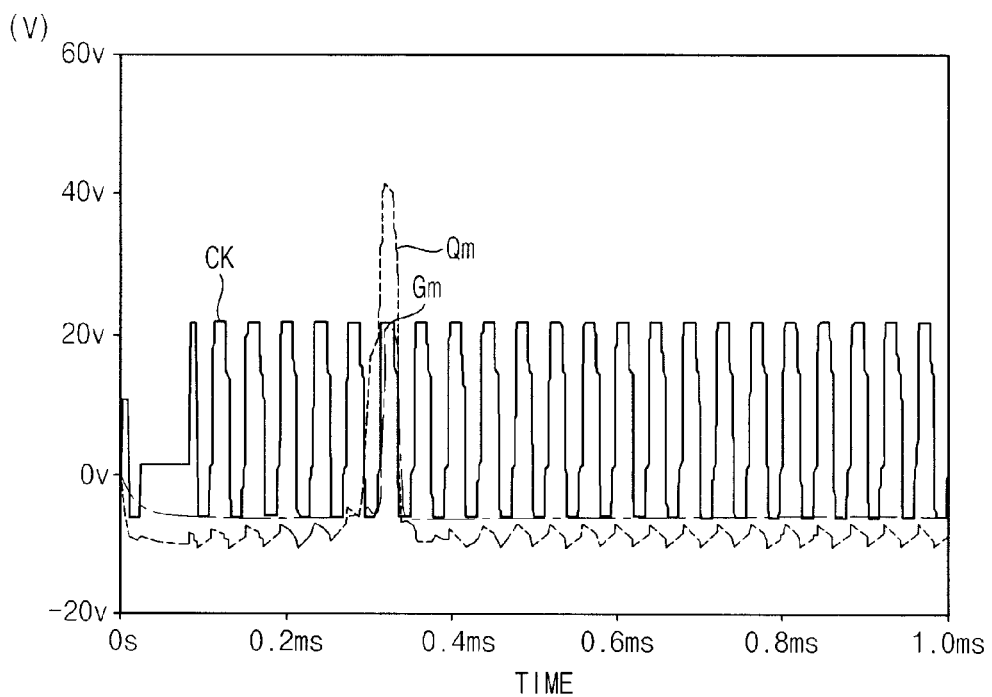
FIG. 21 is a signal timing diagram showing an exemplary embodiment of a voltage at a first node and an output terminal of the m-th stage shown in FIG. 20.

FIG. 21 is a signal timing diagram showing voltages at the first node and an output terminal of FIG. 20.

As shown in FIGS. 20 and 21, the m-th gate signal Gm that is a signal of the output terminal OUT is maintained at a high voltage (e.g., about 22 V) of a clock signal CK applied to the first clock terminal CK1 during an interval which a boosting voltage (e.g., about 41 V) is applied to a first node Q, and the m-th gate signal Gm is maintained at the first low voltage (e.g., about −6 V) during the remaining interval. When the fifth transistor T5 is turned on in response to a carry signal of an (m+2)-th stage that is the third input signal, as shown in FIG. 21 an m-th node signal Qm that is a signal of the first node Q is maintained at the second low voltage (e.g., about −11 V).

In an exemplary embodiment, while the m-th gate signal Gm is maintained at a low voltage in one frame, the first node Q connected to the gate electrode of the first transistor T1 is maintained at a second low voltage VSS2, and the output terminal OUT connected to the source electrode the first transistor T1 is maintained at the first low voltage VSS1. Thus, a gate-source voltage $V_{GS}$ of the first transistor T1 is about −5 V.

According to the present embodiment, a gate-source voltage $V_{GS}$ of the first transistor T1 may be set as a negative voltage during an interval in which the m-th gate signal Gm is maintained at a low voltage, so that high temperature noise may be removed.

Figure 22:
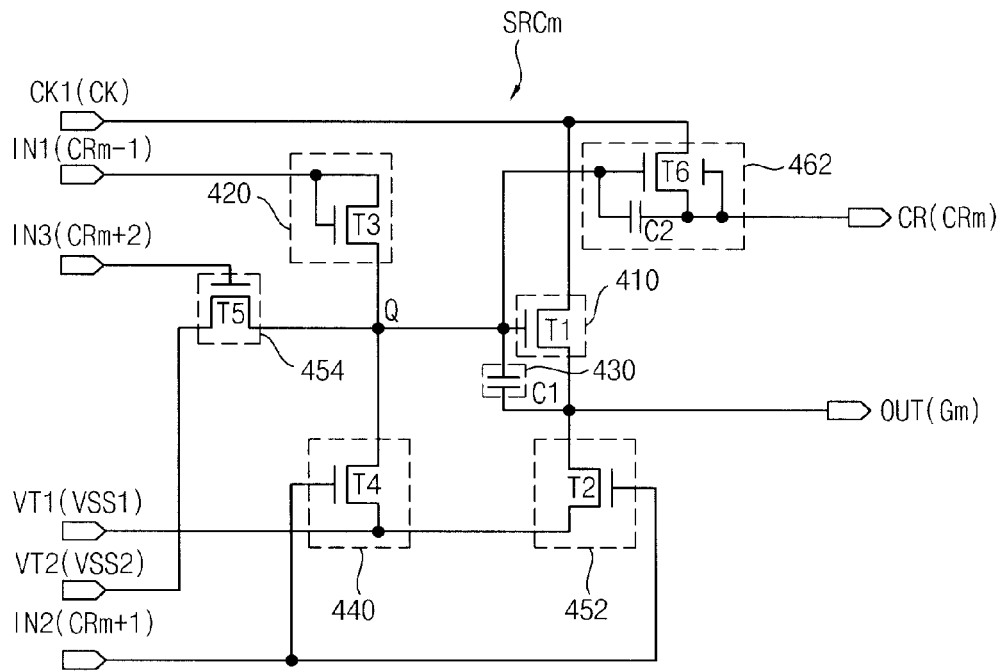
FIG. 22 is a schematic circuit diagram illustrating an alternative exemplary embodiment of an m-th stage according to the present invention.

FIG. 22 is a schematic circuit diagram illustrating an alternative exemplary embodiment of an m-th stage.

The circuit diagram in FIG. 22 is substantially the same as the circuit diagram shown in FIG. 20 except for a carry part 462. The same or like elements shown in FIG. 22 have been labeled with the same reference characters as used above to describe the exemplary embodiments of the m-th stage shown in FIG. 20, and any repetitive detailed description thereof will hereinafter be omitted or simplified.

As shown in FIGS. 20 and 22, the m-th stage SRCm may include an input part, an output part 410, an output driving part, a holding part and a carry part 462. The output driving part may include a buffer part 420, a charging part 430 and a discharging part 440. The holding part may include a first holding part 452 and a second holding part 454.

The carry part 462 includes a sixth transistor T6. The sixth transistor T6 may include a double gate structure. The sixth transistor T6 includes a first gate electrode, which is a bottom gate electrode, connected to a first node Q, a source electrode connected to a carry terminal CT, a drain electrode connected to the first clock terminal CK1, and a second gate electrode, which is an upper gate electrode, connected to an output terminal OUT. The carry part 462 further include a second capacitor C2 connected to the first gate electrode of the sixth transistor T6 and the source electrode of the sixth transistor T6. When a voltage of the first node Q is converted into a high level, the carry part 462 outputs a high voltage of the first clock signal CK as a carry signal. In as exemplary embodiment, the sixth transistor T6 of the carry part 460 further turned on by an output of the carry signal.

When the sixth transistor T6 includes a double gate structure, a signal of the first node Q is stably maintained at the second low level VSS2 during the remaining interval except for an interval in which an m-th gate signal Gm is maintained at a high voltage, and thereby the noise of a gate signal due to a ripple is substantially removed.

Figure 23:
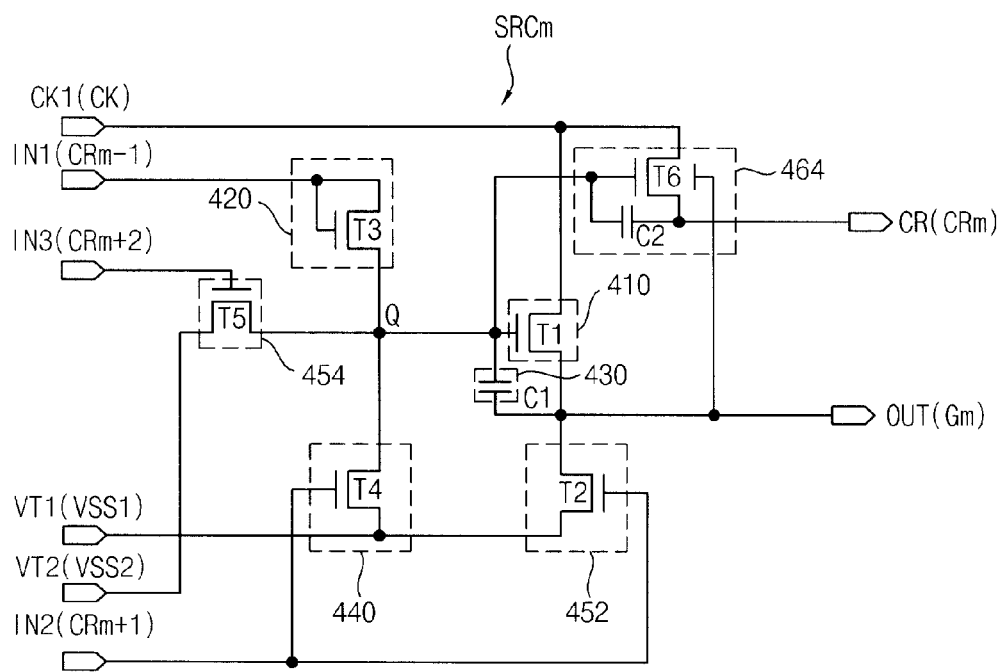
FIG. 23 is a schematic circuit diagram illustrating an alternative exemplary embodiment of an m-th stage according to the present invention.

FIG. 23 is a schematic circuit diagram illustrating an alternative exemplary embodiment of an m-th stage.

The circuit diagram in FIG. 23 is substantially the same as the circuit diagram shown in FIG. 20 except for a carry part 464. The same or like elements shown in FIG. 23 have been labeled with the same reference characters as used above to describe the exemplary embodiments of the m-th stage shown in FIG. 20, and any repetitive detailed description thereof will hereinafter be omitted or simplified.

As shown in FIGS. 20 and 23, the m-th stage SRCm may include an input part, an output part 410, an output driving part, a holding part and a carry part. The output driving part may include a buffer part 420, a charging part 430 and a discharging part 440. The holding part may include a first holding part 452 and a second holding part 454.

The carry part 464 includes a sixth transistor T6. The sixth transistor T6 may include a double gate structure. The sixth transistor T6 includes a first gate electrode, which is a bottom gate electrode, connected to a first node Q, a source electrode connected to a carry terminal CT, a drain electrode connected to the first clock terminal CK1, and a second gate electrode, which is an upper gate electrode, connected to an output terminal OUT. The carry part 460 further include a second capacitor C2 connected to the first gate electrode of the sixth transistor T6 and the source electrode of the sixth transistor T6. When a voltage of the first node Q is converted into a high level, the carry part 464 outputs a high voltage of the first clock signal CK as a carry signal. When a high voltage is applied to the output terminal OUT, the sixth transistor T6 of the carry part 464 further turned on through the second gate electrode.

When the sixth transistor T6 includes a double gate structure, a signal of the first node Q is stably maintained at the second low level VSS2 during the remaining interval except for an interval in which an m-th gate signal Gm is maintained at a high voltage, and thereby the noise of a gate signal due to a ripple may be substantially removed.

Figure 24:
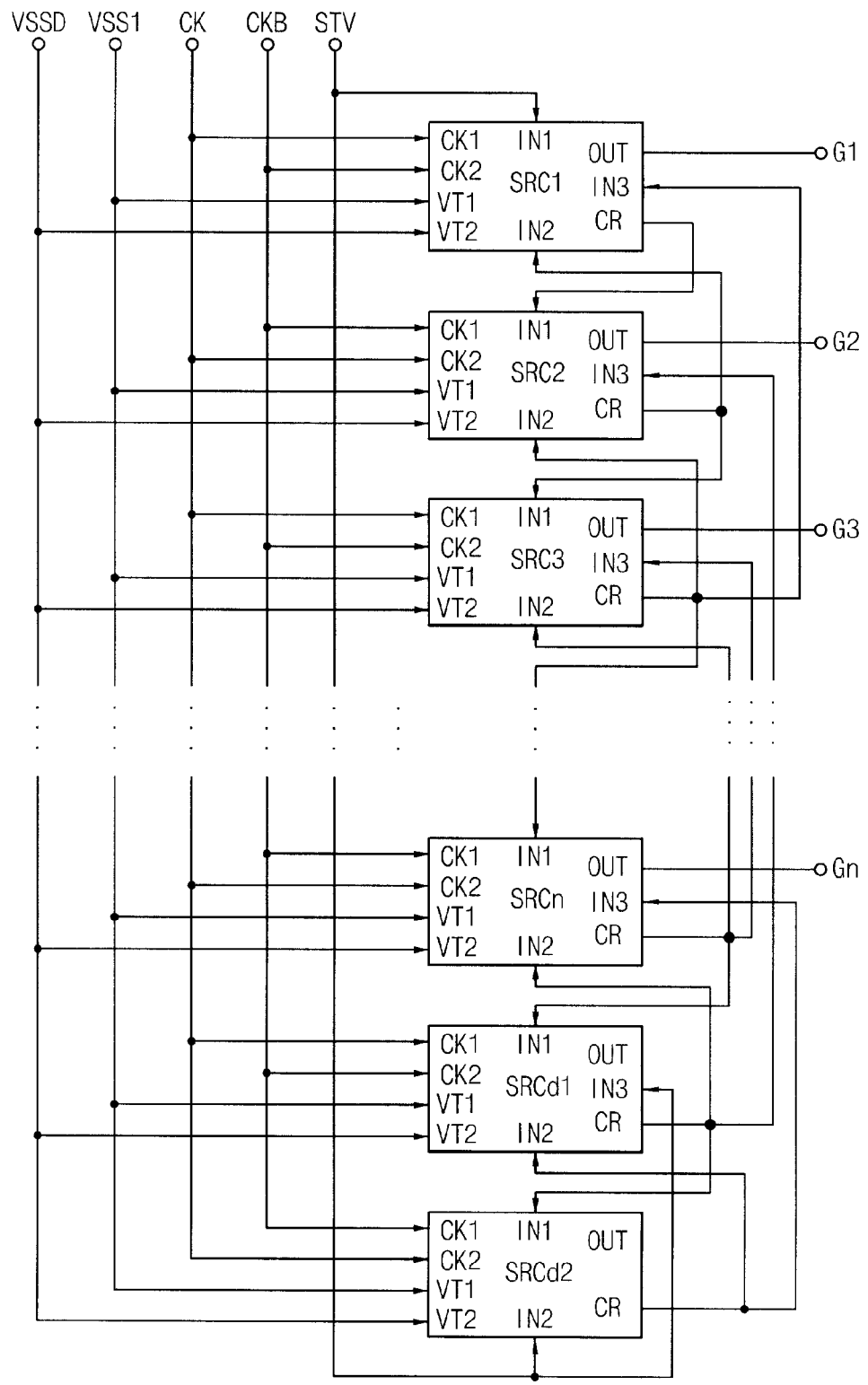
FIG. 24 is a block diagram illustrating an alternative exemplar embodiment of a gate drive circuit according to the present invention.

FIG. 24 is a block diagram illustrating an alternative exemplary embodiment of a gate drive circuit.

The block diagram in FIG. 24 is substantially the same as the block diagram shown in FIG. 19 except for a second clock terminal CK2. The same or like elements shown in FIG. 24 have been labeled with the same reference characters as used above to describe the exemplary embodiments of the gate drive circuit shown in FIG. 19, and any repetitive detailed description thereof will hereinafter be omitted or simplified.

As shown in FIG. 24, the gate drive circuit includes a shift register including stages SRC1 to SRCd2 cascaded together. The stages SRC1 to SRCd2 may include n driving stages SRC1 to SRCn and two dummy stages, for example, the first dummy stage SRCd1 and the second dummy stage SRCd2.

Each of the stages SRC1 to SRCd2 may include a first clock terminal CK1, a second clock terminal CK2, a first input terminal IN1, a second input terminal IN2, a third input terminal IN3, a first voltage terminal VT1, a second voltage terminal VT2, a carry terminal CT and an output terminal OUT.

Each of the first and second clock terminals CK1 and CK2 receives a first clock signal CK and a second clock signal CKB having phase opposite to a phase of the first clock signal CK. In an exemplary embodiment, each of first clock terminals CK1 of odd-numbered stages SRC1, SRC3, e.g., receives a first clock signal CK, and each of second clock terminals CK2 of odd-numbered stages SRC1, SRC3, e.g., receives a second clock signal CKB. A first clock terminal CK1 of each of the even-numbered stages SRC2, SRC4, e.g., receives the second clock signal CKB, and a second clock terminal CK2 of each of the even-numbered stages SRC2, SRC4, e.g., receives the first clock signal CK.

Figure 25:
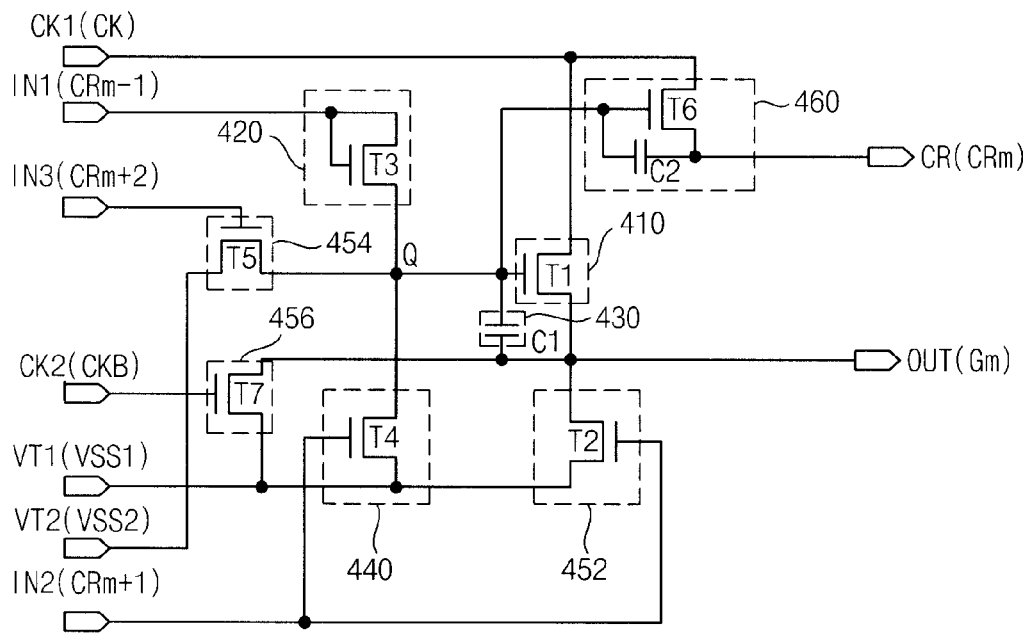
FIG. 25 is a schematic circuit diagram illustrating an alternative exemplary embodiment of an m-th stage of the gate drive circuit shown in FIG. 24.

FIG. 25 is a schematic circuit diagram illustrating an exemplary embodiment of an m-th stage of the stages in FIG. 24.

The circuit diagram in FIG. 25 is substantially the same as the circuit diagram shown in FIG. 20 except for a third holding part 456. The same or like elements shown in FIG. 25 have been labeled with the same reference characters as used above to describe the exemplary embodiments of the m-th stage shown in FIG. 20, and any repetitive detailed description thereof will hereinafter be omitted or simplified.

As shown in FIG. 25, the m-th stage SRCm may include an input part, an output part 410, a holding part and a carry part 460. The output driving part may include a buffer part 420, a charging part 430 and a discharging part 440. The holding part may include a first holding part 452, a second holding part 454 and the third holding part 456.

The third holding part 456 includes a seventh transistor T7. The seventh transistor T7 includes a gate electrode connected to a second clock terminal CK2, a source electrode connected to a first voltage terminal VT1 and a drain electrode connected to the output terminal OUT. The third holding part 456 maintains a voltage of the output terminal OUT at a first low voltage VSS1 applied through the first voltage terminal VT1 in response to a second clock signal CKB applied to the second clock terminal CK2.

In an exemplary embodiment, the m-th gate signal is stably maintained at the first low level VSS1 during the remaining interval except for an interval in which the m-th gate signal is maintained at a high voltage through the third holding part 456, and thereby high temperature noise may be substantially removed.

Figure 26:
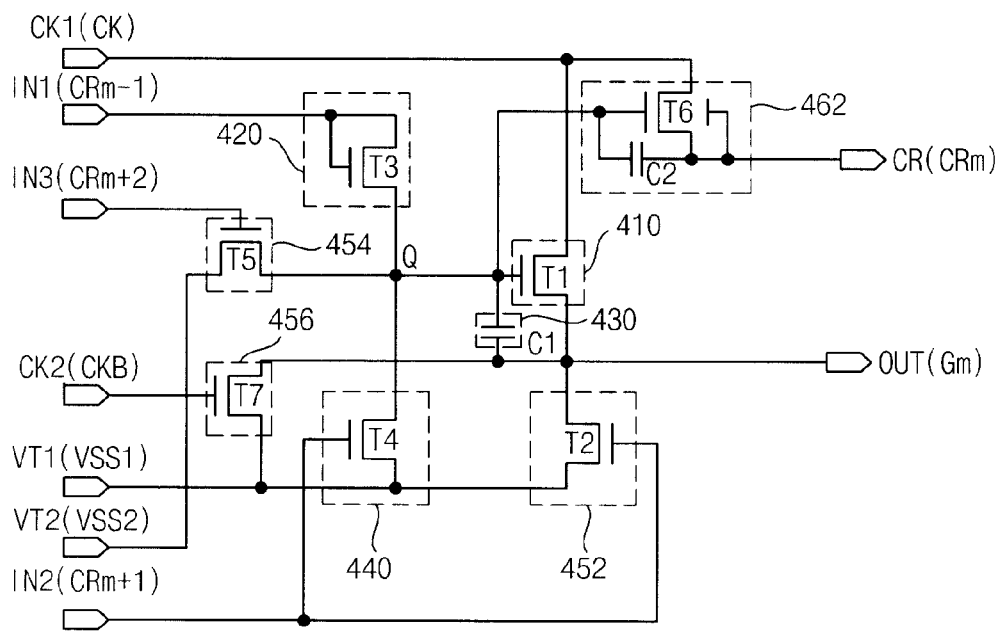
FIG. 26 is a schematic circuit diagram illustrating an alternative exemplary embodiment of an m-th stage according to the present invention.

FIG. 26 is a circuit diagram illustrating an alternative exemplary embodiment of the m-th stage.

The circuit diagram in FIG. 26 is substantially the same as the circuit diagram shown in FIG. 25 except for a carry part 462. The same or like elements shown in FIG. 26 have been labeled with the same reference characters as used above to describe the exemplary embodiments of the m-th stage shown in FIG. 25, and any repetitive detailed description thereof will hereinafter be omitted or simplified.

As shown in FIG. 26, the m-th stage SRCm may include an input part, an output part 410, an output driving part, a holding part and a carry part 462. The output driving part may include a buffer part 420, a charging part 430 and a discharging part 440. The holding part may include a first holding part 452, a second holding part 454 and a third holding part 456.

The carry part 462 includes a sixth transistor T6. The sixth transistor T6 employs a double gate structure. The sixth transistor T6 includes a first gate electrode connected to a first node Q, a source electrode connected to a carry terminal CT, a drain electrode connected to the first clock terminal CK1, and a second gate electrode connected to a carry terminal CR. In an exemplary embodiment, the first gate electrode is a bottom gate electrode, and a second gate electrode is an upper gate electrode. The carry part 462 further include a second capacitor C2 connected to the first gate electrode of the sixth transistor T6 and the source electrode of the sixth transistor T6. When a voltage of the first node Q is converted into a high level, the carry part 462 outputs a high voltage of the first clock signal CK as a carry signal.

In an exemplary embodiment, when the sixth transistor T6 includes a double gate structure, a signal of the first node Q is stably maintained at the second low level VSS2 during the remaining interval except for an interval in which an m-th gate signal Gm is maintained at a high voltage. Thus, the noise of a gate signal due to a ripple may be substantially removed. When the m-th gate signal is stably maintained at the first low level VSS1 during the remaining interval except for an interval in which an m-th gate signal is maintained at a high voltage through the third holding part 456, high temperature noise of a gate signal may be substantially removed.

Figure 27:
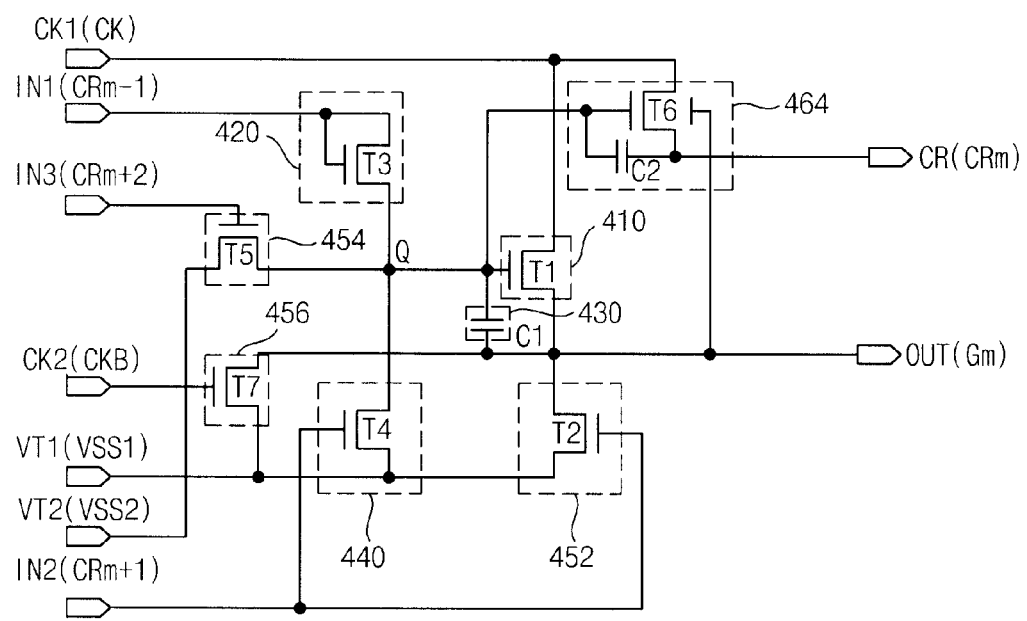
FIG. 27 is a schematic circuit diagram illustrating an alternative exemplary embodiment of an m-th stage according to the present invention.

FIG. 27 is a circuit diagram illustrating an alternative exemplary embodiment of the m-th stage.

The circuit diagram in FIG. 27 is substantially the same as the circuit diagram shown in FIG. 25 except for a carry part 464. The same or like elements shown in FIG. 27 have been labeled with the same reference characters as used above to describe the exemplary embodiments of the m-th stage shown in FIG. 25, and any repetitive detailed description thereof will hereinafter be omitted or simplified.

As shown in FIG. 27, the m-th stage SRCm may include an input part, an output part 410, an output part, a holding part and a carry part 464. The output driving part may include a buffer part 420, a charging part 430 and a discharging part 440. The holding part may include a first holding part 452, a second holding part 454 and a third holding part 456.

The carry part 464 includes a sixth transistor T6. The sixth transistor T6 may include a double gate structure. The sixth transistor T6 includes a first gate electrode, which is a bottom gate electrode, connected to a first node Q, a source electrode connected to a carry terminal CT, a drain electrode connected to the first clock terminal CK1, and a second gate electrode, which is an upper gate electrode, connected to an output terminal OUT. The carry part 464 further include a second capacitor C2 connected to the first gate electrode of the sixth transistor T6 and the source electrode of the sixth transistor T6. When a voltage of the first node Q is converted into a high level, the carry part 464 outputs a high voltage of the first clock signal CK as a carry signal. When a voltage of the first node Q is discharged to the second low voltage VSS2, the carry part 464 outputs the second low voltage VSS2 as a carry signal.

In an exemplary embodiment, when the sixth transistor T6 includes a double gate structure, a signal of the first node Q is stably maintained at the second low level VSS2 during the remaining interval except for an interval in which an m-th gate signal is maintained at a high voltage. Thus, the noise of a gate signal due to a ripple may be substantially removed.

According to exemplary embodiments of the present invention as described herein, a negative voltage may be applied between a gate electrode and a source electrode of an output terminal of a gate drive circuit during an interval in which a gate signal is maintained at a low voltage, and thereby high temperature noise is substantially removed. A carry signal of a subsequent stage of each of stages cascaded together is used as a control signal of a discharging part which discharges a first node voltage to a low voltage and a first holding part which pulls down an output terminal voltage to a low voltage, and thereby deteriorations of the discharging part and the first holding part is effectively prevented and the gate drive circuit is reliable when a gate drive circuit is driven for a long time.

The foregoing is illustrative of the present invention and is not to be construed as limiting thereof. Although exemplary embodiments of the present invention have been described herein, those or ordinary skill in the art will readily appreciate that modifications are possible in the exemplary embodiments without departing from the spirit or scope of the present invention. Therefore, it will be understood that the foregoing is illustrative of exemplary embodiments of the present invention and is not to be construed as limited to the specific exemplary embodiments herein disclosed, and that various modifications to the disclosed exemplary embodiments, as well as other alternative exemplary embodiments, are included within the spirit and scope of the present invention as defined by the following claims.

What is claimed is:

1. A gate drive circuit including stages which are cascaded and which output gate signals, each of the stages comprising:
   a first node, a voltage of which is converted to a high voltage in response to one of a vertical start signal and a carry signal of one of previous stages;
   an output part which outputs a first clock signal as a gate signal through an output terminal in response to the high voltage at the first node;
   a first holding part which applies a first low voltage to the output terminal in response to a gate signal output from at least one of following stages; and
   a second holding part which applies a second low voltage, which is less than the first low voltage, to the first node in response to a gate signal output from at least one stage among following stages.

2. The gate drive circuit of claim 1, wherein
   each of the stages further comprises a second node which receives the second low voltage when the gate signal is outputted through the output terminal, and
   the first node receives the second low voltage based on a voltage of the second node.

3. The gate drive circuit of claim 2, wherein the second node further receives the second low voltage when a carry signal of at least one of the stages is applied to each of the stages.

4. The gate drive circuit of claim 1, wherein
   the first node is bootstrapped when the gate signal is outputted through the output terminal,
   the first low voltage is applied to the first node after the first node is bootstrapped, and
   the second low voltage is applied to the first node in response to a gate signal output from at least one of following stages.

5. The gate drive circuit of claim 2, wherein
   each of the stages further comprises a carry part which outputs the first clock signal through a carry terminal in response to the high voltage of the first node, and
   the carry terminal receives the second low voltage in response to a high voltage of the second node.

6. The gate drive circuit of claim 5, wherein the carry part is turned on when a high voltage is applied to the carry terminal.

7. The gate drive circuit of claim 5, wherein the carry part is turned on when a high voltage is applied to the output terminal.

8. A gate drive circuit including stages which are cascaded and which output gate signals, each of the stages comprising:
   a first node, a voltage of which is converted to a high voltage in response to one of a vertical start signal and a carry signal of a previous stage;
   an output part which outputs a first clock signal as a gate signal through an output terminal in response to the high voltage of the first node;
   a first holding part which applies a first low voltage to the output terminal in response to a gate signal output from at least one of following stages; and
   a second holding part which applies a dynamic low voltage including one of the first low voltage and a second low voltage, which is less than the first low voltage, to the first node in response to a gate signal output from at least one stage among following stages.

9. The gate drive circuit of claim 8, wherein each of the stages further comprises a second node which receives the dynamic low voltage when the gate signal is outputted through the output terminal, and
   the first node receives the dynamic low voltage based on a voltage of the second node.

10. The gate drive circuit of claim 9, wherein the second node further receives the dynamic low voltage when a carry signal of at least one of previous stages is applied to the each of the stages.

11. The gate drive circuit of claim 8, wherein
    the first node is bootstrapped when the gate signal is outputted through the output terminal,
    the first low voltage is applied to the first node after the first node is bootstrapped, and
    the dynamic low voltage is applied to the first node in response to a gate signal output from at least one of following stages.

12. The gate drive circuit of claim 9, wherein each of the stages further comprises a carry part which outputs the first clock signal through a carry terminal in response to the high voltage of the first node, and
    the carry terminal receives the dynamic low voltage in response to a high voltage of the second node.

13. The gate drive circuit of claim 12, wherein the carry part is turned on when the high voltage is applied to the carry terminal.

14. The gate drive circuit of claim 12, wherein the carry part is turned on when the high voltage is applied to the output terminal.

* * * * *